US006723612B2

(12) United States Patent
Iijima et al.

(10) Patent No.: US 6,723,612 B2
(45) Date of Patent: Apr. 20, 2004

(54) SEMICONDUCTOR INTEGRATED CIRCUIT DEVICE AND METHOD OF MANUFACTURING THE SAME

(75) Inventors: Shinpei Iijima, Tokyo (JP); Hiroshi Sakuma, Tokyo (JP)

(73) Assignees: Renesas Technology Corproation, Tokyo (JP); NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/353,953

(22) Filed: Jan. 30, 2003

(65) Prior Publication Data

US 2003/0132462 A1 Jul. 17, 2003

Related U.S. Application Data

(62) Division of application No. 10/230,107, filed on Aug. 29, 2002.

(30) Foreign Application Priority Data

Aug. 31, 2001 (JP) ........................................ 2001-263734

(51) Int. Cl.⁷ ............................................... H01L 21/20
(52) U.S. Cl. ....................... 438/396; 438/240; 438/253; 257/310
(58) Field of Search ................................ 438/396, 240, 438/253; 257/310

(56) References Cited

U.S. PATENT DOCUMENTS 6,534,375 B2 * 3/2003 Iijima et al. ................. 438/386

FOREIGN PATENT DOCUMENTS

| JP | 10-79481 | 3/1998 | |
|----|----------|--------|--|
| JP | 10-209394 | 8/1998 | |
| JP | 11-307736 | 11/1999 | |
| JP | 2001-217403 | * 8/2001 | ......... H01L/27/108 |

* cited by examiner

*Primary Examiner*—Amir Zarabian
*Assistant Examiner*—Christy Novacek
(74) *Attorney, Agent, or Firm*—Miles & Stockbridge PC

(57) ABSTRACT

In a semiconductor integrated circuit device, a polycrystalline silicon film is formed along an inner wall of a trench in which a capacitor is to be formed, and the polycrystalline silicon film and a lower electrode are contacted to each other on the entire inner wall of the trench. Oxygen permeated into the lower electrode during a thermal treatment of a tantalum oxide film is consumed at an interface between the polycrystalline silicon film and the lower electrode. Thus, oxygen does not reach the surface of a silicon plug below the lower electrode that would cause oxidation on the surface of the silicon plug and form a high-resistance oxide layer when a dielectric film formed on a lower electrode of a capacitor of a DRAM is subjected to a thermal treatment in an oxygen atmosphere.

20 Claims, 43 Drawing Sheets

SEMICONDUCTOR INTEGRATED CIRCUIT DEVICE AND METHOD OF MANUFACTURING THE SAME

CROSS-REFERENCE TO RELATED APPLICATIONS

This application is a divisional of application Ser. No. 10/230,107 filed Aug. 29, 2002.

TECHNICAL FIELD OF THE INVENTION

The present invention relates to a semiconductor integrated circuit device and a method of manufacturing the same. More particularly, the present invention relates to a technique effectively applied to a semiconductor integrated circuit device having a DRAM (Dynamic Random Access Memory).

BACKGROUND OF THE INVENTION

Memory cells of DRAM are placed at intersections between a plurality of word lines and a plurality of bit lines arranged in a matrix on a main surface of a semiconductor substrate. One memory cell comprises a MISFET (Metal Insulator Semiconductor Field Effect Transistor) for selecting a memory cell and a data storage capacitor connected in series to the MISFET.

The MISFET for selecting a memory cell is formed in an active region surrounded by a device isolation region, and is mainly composed of a gate insulating film, a gate electrode combined with a word line, and a pair of semiconductor regions constituting a source and a drain. Typically, two MISFETs for selecting a memory cell are formed in each of the active regions, and these two MISFETs have a common source or a common drain (semiconductor region) at the center of the active region.

The bit line is arranged on the MISFET for selecting a memory cell and is electrically connected to one (the common semiconductor region which the two MISFETs share) of the source and drain (semiconductor regions) via a connection hole in which a plug made of polycrystalline silicon or the like is buried. Also, the data storage capacitor is arranged on the bit line and is electrically connected to the other of the source and drain (semiconductor regions) of the MISFET for selecting a memory cell via a connection hole in which a plug made of polycrystalline silicon or the like is buried.

As described above, as measures for compensating the reduction in stored charge due to the scaling down of a memory cell, a stacked capacitor structure is adopted in the recent DRAM, in which a data storage capacitor is arranged on a bit line.

However, in the case of a large capacity DRAM with a capacity more than 256 megabit in which the scaling down of a memory cell is further promoted, it is considered that only the adoption of the stacked capacitor structure cannot sufficiently compensate the reduction in the stored charge. Thus, the introduction of a high dielectric material such as tantalum oxide ($Ta_2O_5$) as a capacitor insulating film of the data storage capacitor has been developed.

However, the high relative dielectric constant cannot be obtained even by simply depositing the above-mentioned high dielectric material such as tantalum oxide, and the leak current of the film is large. Therefore, the crystallization of the film and the improvement of the film quality by means of the thermal treatment in a high-temperature oxygen atmosphere at 750° C. to 800° C. are required after forming the film. However, the thermal treatment in such a high temperature causes a problem of characteristic variation in the MISFET.

For its prevention, in the case where the high dielectric material is used to form a capacitor insulating film, platinum group metal, for example, Ru (ruthenium) is used as a lower electrode serving as an underlayer of the insulating film. The reason thereof is as follows. That is, in the case where a high dielectric film is deposited on a surface of a platinum group metal, the crystallization of the film and the improvement of the film quality can be achieved by the low-temperature thermal treatment at 700° C. or lower. Therefore, the total amount of heat applied in the thermal treatment in the entire manufacturing process can be reduced, and thus, the characteristic variation in the MISFET can be prevented.

Meanwhile, in the case where the above-mentioned platinum group metal is used as the material of the lower electrode, since the platinum group metal is an oxygen permeable material, oxygen permeates through the high dielectric film and the lower electrode and reaches the silicon plug below them if the thermal treatment is performed in the oxygen atmosphere after forming the high dielectric film on the surface of the lower electrode. As a result, the platinum group metal and the silicon are reacted to form a high-resistance layer made of metal silicide at the interface therebetween.

For the solution of the above-mentioned problem, a method in which a barrier layer for preventing the reaction between the lower electrode made of the platinum group metal and the silicon plug is formed therebetween has been proposed.

The Japanese Patent Laid-Open No. 10-79481 proposes a conductive layer (metal silicon nitride layer) as a barrier layer, which contains refractory metal such as Ti (titanium), W (tungsten), Ta (tantalum), Co (cobalt), and Mo (molybdenum), silicon, and nitrogen. Such a conductive layer is provided for the purpose of avoiding such disadvantages that a metal silicide layer is formed by mutual diffusion of platinum group metal and silicon due to a thermal treatment at 700° C. to 800° C. performed in the reflow and planarization of a silicon oxide film, and that the metal silicide layer is oxidized to form a silicon oxide layer with small dielectric constant. In the invention, the barrier layer is preferably formed by laminating a first layer containing columnar crystal or amorphous and a second layer containing granular crystals. Also, a layer containing Ti is preferably formed between the barrier layer and a silicon plug for improving the adhesion therebetween.

The Japanese Patent Laid-Open No. 10-209394 points out the problems as follows. That is, in such a case where a dielectric film formed on a lower electrode and a silicon plug below the lower electrode are contacted to each other due to the mask misalignment when forming the lower electrode on a connection hole in which the silicon plug is buried, the reaction between oxygen in the dielectric film and silicon is caused. As a result, a high-resistance silicon oxide film is formed and the leak current in the dielectric film is increased due to the shortage of oxygen. For the solution of the problems, the gazette proposes to form a blocking film made of silicon nitride between the dielectric film and the silicon plug.

The Japanese Patent Laid-Open No. 11-307736 relates to a ferroelectric memory and discloses a technique in which a tantalum silicon nitride (TaSiN) film as a diffusion barrier layer is formed on a silicon plug and an Ir film as an oxygen blocking film is formed on the diffusion barrier film when forming a capacitor composed of a lower electrode made of iridium oxide (IrO$_x$), a dielectric film made of ferroelectric substance such as PZT (lead zirconate titanate), and an upper electrode made of platinum group metal such as Pt on the silicon plug.

SUMMARY OF THE INVENTION

As described above, in the conventional technique, a barrier layer provided between a lower electrode of a capacitor and a silicon plug functions to prevent the formation of a high-resistance oxide film on a surface of the silicon plug at the time when a thermal treatment of a capacitor insulating film made of high dielectric substance formed on the lower electrode is performed in an oxygen atmosphere.

However, with the further scaling down of the memory cell, the diameter of a through hole in which a silicon plug is buried is reduced, and a surface area of a barrier layer formed on the silicon plug is also reduced. As a result, when ,performing a thermal treatment of a high dielectric film on a lower electrode in an oxygen-containing atmosphere, the contact resistance between the lower electrode and the silicon plug is increased due to the extremely small surface area of the silicon plug even in the case where an oxide layer formed on the surface of the barrier layer is extremely thin. Consequently, a conduction failure may be caused in an extreme case.

An object of the present invention is to provide a technique for preventing a conduction failure between a lower electrode and a silicon plug caused by a thermal treatment of a dielectric/film formed on a lower electrode of a capacitor.

The above and other objects and novel characteristics of the present invention will be apparent from the description and the accompanying drawings of this specification.

The typical ones of the inventions disclosed in this application will be briefly described as follows.

An aspect of a semiconductor integrated circuit device according to the present invention is a DRAM, which is provided with: a first insulating film formed over a main surface of a semiconductor substrate and having a first connection hole in which a first conductive layer is buried; a second insulating film formed on the first insulating film and having a trench over the first connection hole; and a capacitor formed in the trench, wherein the capacitor comprises a lower electrode constituted by a second conductive layer formed on a sidewall and bottom surface of the trench, a capacitor insulating film formed on the lower electrode, and an upper electrode constituted by a third conductive layer formed on the capacitor insulating film, and a metal silicide layer electrically connected to the first conductive layer in the first connection hole is provided between the sidewall and bottom surface of the trench and the lower electrode.

A method of manufacturing a semiconductor integrated circuit device according to the present invention includes the steps of: (a) forming a first connection hole in an first insulating film formed over a main surface of a semiconductor substrate, and burying a first conductive layer in the first connection hole; (b) forming a second insulating film on the first insulating film, and forming a trench in the second insulating film over the first connection hole; (c) forming a metal silicide layer on a sidewall and bottom surface of the trench, the metal silicide layer being electrically connected to the first conductive layer in the first connection hole; (d) forming a lower electrode of a capacitor on the metal silicide layer; (e) forming a capacitor insulating film of the capacitor on the lower electrode; and (f) forming an upper electrode of the capacitor on the capacitor insulating film.

BRIEF DESCRIPTIONS OF THE DRAWINGS

DESCRIPTION OF THE PREFERRED EMBODIMENTS

Hereinafter, embodiments of the present invention will be described with reference to the accompanying drawings. Note that components having the same function are denoted by the same reference symbols throughout the drawings for describing the embodiment and the repetitive description thereof will be omitted.

First Embodiment

A method of manufacturing a DRAM in this embodiment will be described along the process flow with reference to FIGS. 1 to 42.

Figure 1:
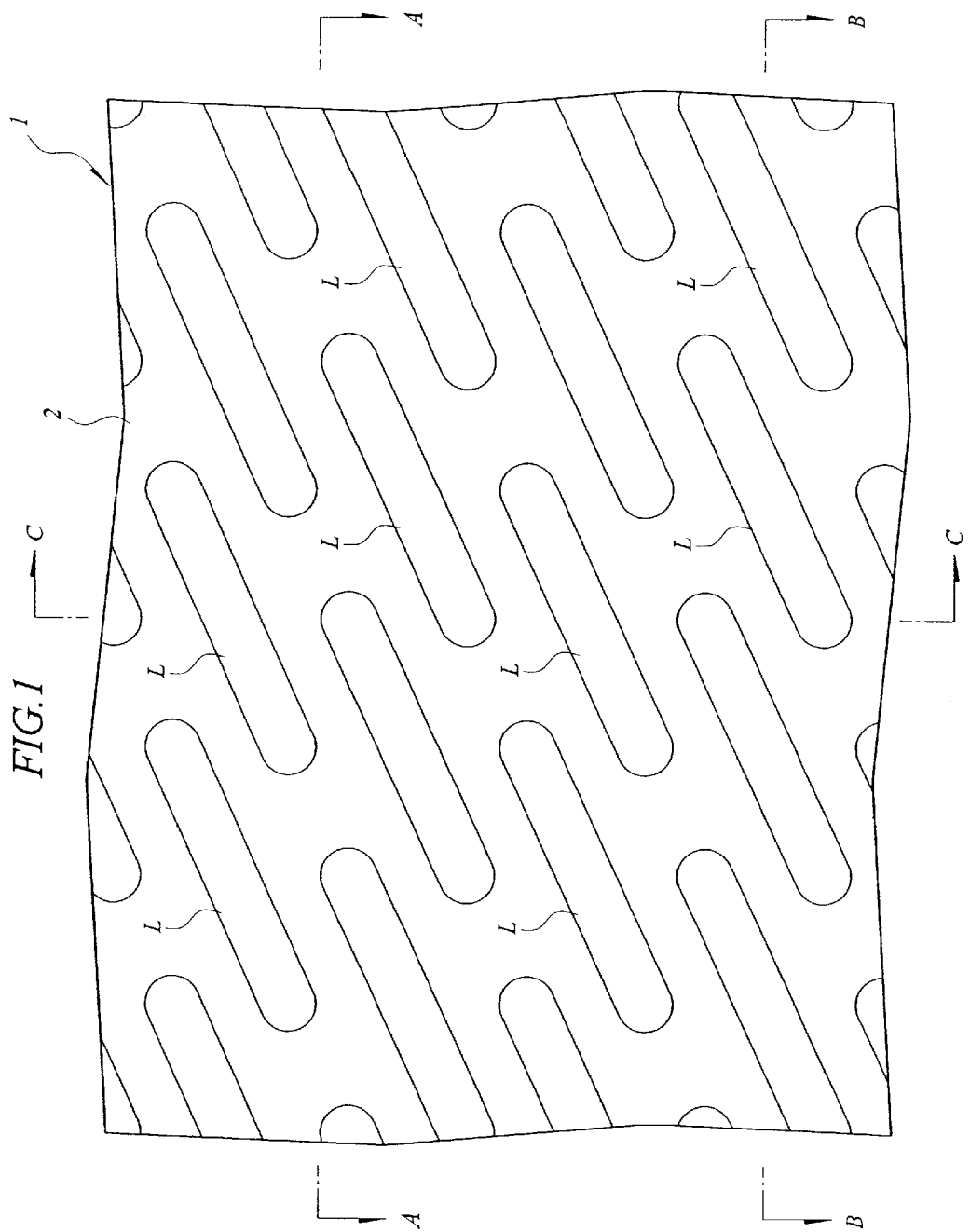
FIG. 1 is a plan view showing the principal part of a semiconductor substrate, which illustrates a method of manufacturing a DRAM according to an embodiment of the present invention.
Figure 2:
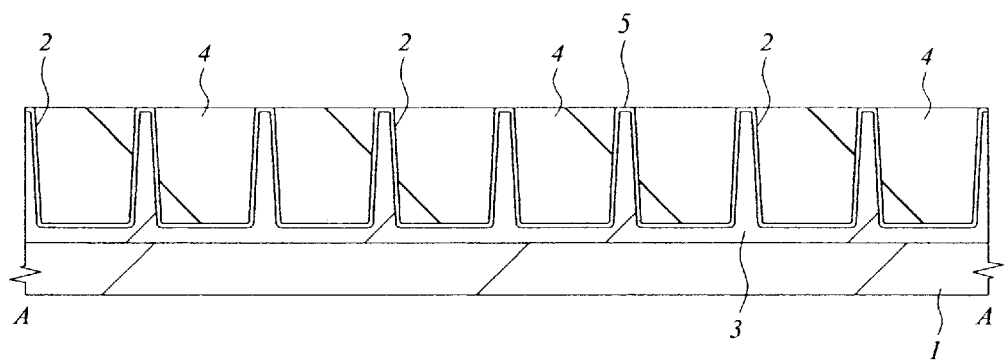
FIG. 2 is a sectional view showing the principal part of a semiconductor substrate, which illustrates a method of manufacturing a DRAM according to an embodiment of the present invention.
Figure 3:
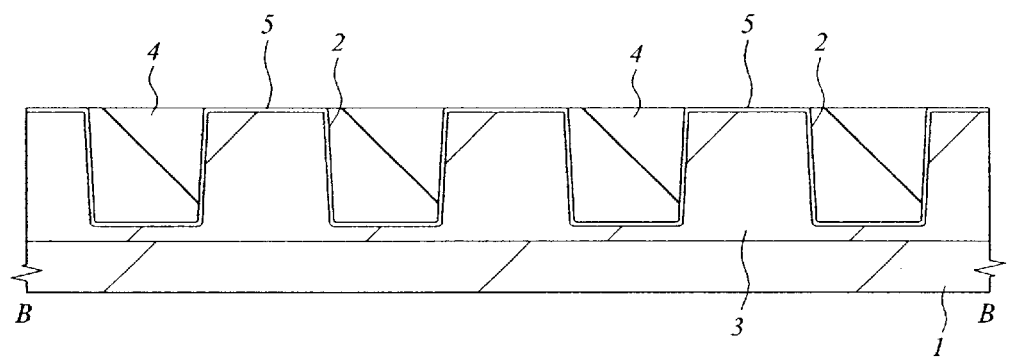
FIG. 3 is a sectional view showing the principal part of a semiconductor substrate, which illustrates a method of manufacturing a DRAM according to an embodiment of the present invention.
Figure 4:
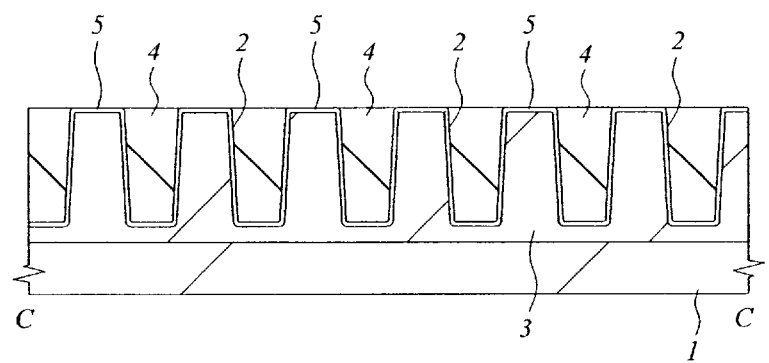
FIG. 4 is a sectional view showing the principal part of a semiconductor substrate, which illustrates a method of manufacturing a DRAM according to an embodiment of the present invention.

First, as shown in FIG. 1 (plan view showing the principal part of a memory array), FIG. 2 (sectional view taken along the line A—A in FIG. 1), FIG. 3 (sectional view taken along the line B—B in FIG. 1), and FIG. 4 (sectional view taken along the line C—C in FIG. 1), a device isolation trench 2 is formed in a device isolation region on a main surface of a substrate 1 made of, for example, p-type single crystal silicon. The device isolation trench 2 is formed in such a manner as follows. That is, a trench is formed by etching the surface of the substrate 1 to a depth of about 300 to 400 nm. Subsequently, a silicon oxide film 4 (thickness: about 600 nm) is deposited in the trench and on the substrate 1 by the CVD (Chemical Vapor Deposition) method. Thereafter, the silicon oxide film 4 is polished and planarized by the CMP (Chemical Mechanical Polishing) method. The silicon oxide film 4 is deposited by the plasma CVD method using oxygen (or ozone) and tetraethoxysilane (TEOS) as source gas, and then, the film is densified by, for example, performing the dry oxidation at about 1000° C.

As shown in FIG. 1, the formation of the device isolation trench 2 simultaneously forms a plurality of oval island-shaped active regions (L) surrounded by the device isolation trench 2. As described later, two memory cell selecting MISFETs Qs sharing a common source or a common drain are formed on each of the active regions (L).

Next, B (boron) is ion-implanted into the substrate 1, thereby forming a p-type well 3. Subsequently, after cleaning a surface of the p-type well 3 with using a cleaning solution containing HF (hydrofluoric acid), a clean gate insulating film 5 (thickness: about 6 nm) made of a silicon oxide is formed on the surface of the active region (L) of the p-type well 3 by the thermal oxidation of the substrate 1. Note that, in addition to the silicon oxide insulating film formed by the thermal oxidation of the substrate 1, a silicon nitride insulating film and a metal oxide insulating film (e.g., tantalum oxide film and titanium oxide film) with higher dielectric constant can also be used as the gate insulating film 5. These high dielectric insulating films are formed on the substrate 1 by the CVD method or the sputtering method.

Figure 5:
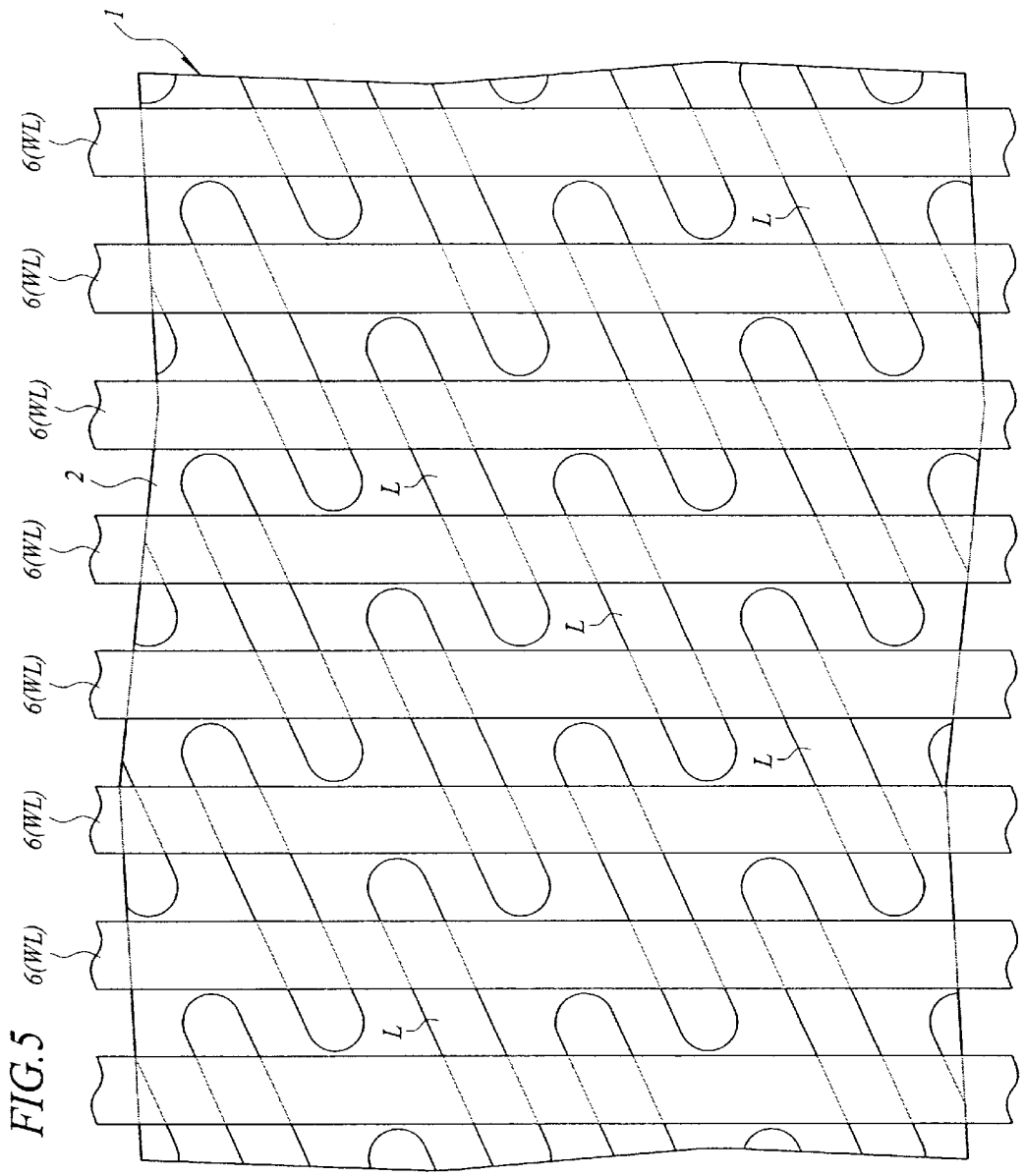
FIG. 5 is a plan view showing the principal part of a semiconductor substrate, which illustrates a method of manufacturing a DRAM according to an embodiment of the present invention.
Figure 6:
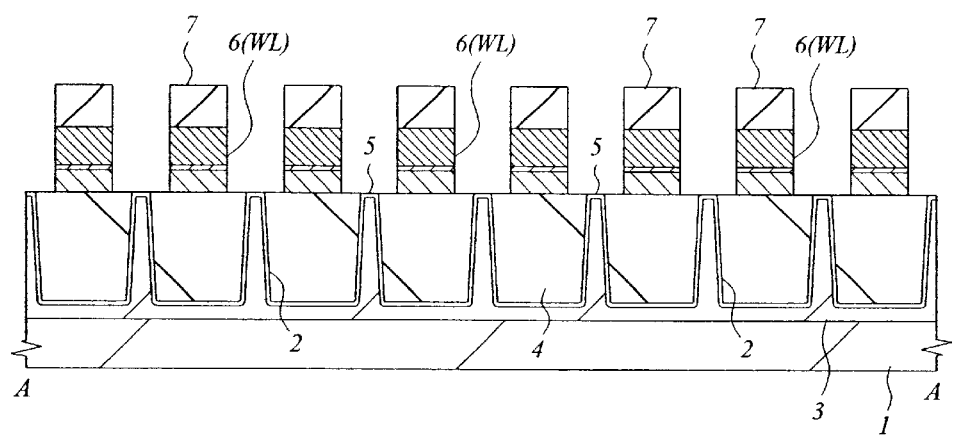
FIG. 6 is a sectional view showing the principal part of a semiconductor substrate, which illustrates a method of manufacturing a DRAM according to an embodiment of the present invention.
Figure 7:
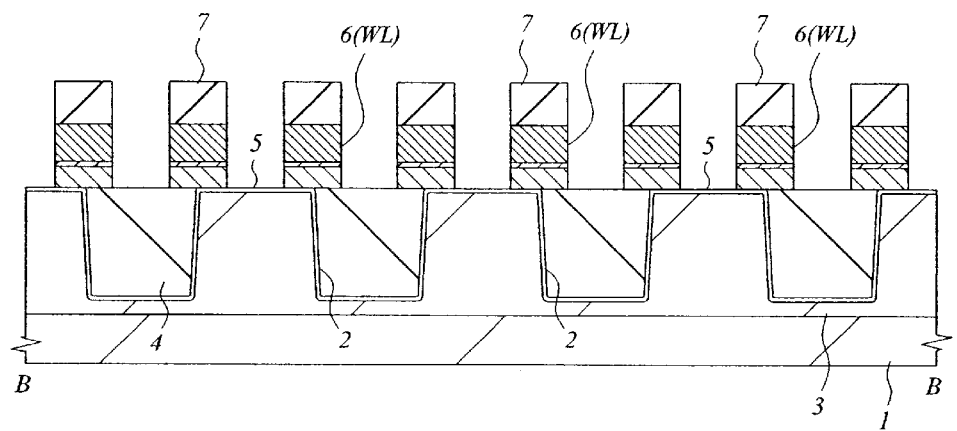
FIG. 7 is a sectional view showing the principal part of a semiconductor substrate, which illustrates a method of manufacturing a DRAM according to an embodiment of the present invention.

Next, as shown in FIGS. 5 to 7, a gate electrode 6 is formed on the gate insulating film 5. The gate electrode 6 functions as a word line (WL) in the region other than the active region (L). The gate electrode 6 (word line WL) is formed in such a manner as follows. That is, after sequentially depositing an n-type polycrystalline silicon film (thickness: about 70 nm) doped with P (phosphorus), a barrier metal film (thickness: about 5 nm to 10 nm) made of WN (tungsten nitride) or TiN (titanium nitride), W (tungsten) film (thickness: about 100 nm), and a silicon nitride film 7 (thickness: about 150 nm) on the gate insulating film 5, these films are dry-etched with using a photoresist film as a mask. The polycrystalline silicon film and the silicon nitride film 7 are deposited by the CVD method, and the barrier metal film and the W film are deposited by the sputtering method.

Figure 8:
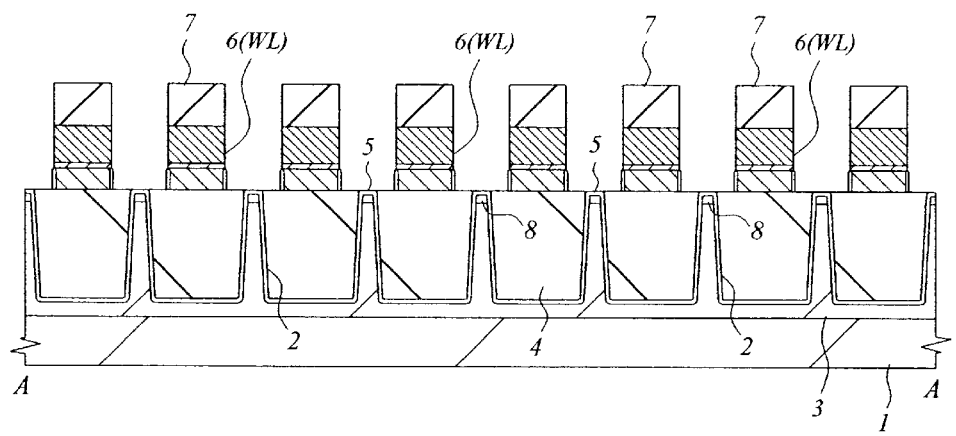
FIG. 8 is a sectional view showing the principal part of a semiconductor substrate, which illustrates a method of manufacturing a DRAM according to an embodiment of the present invention.
Figure 9:
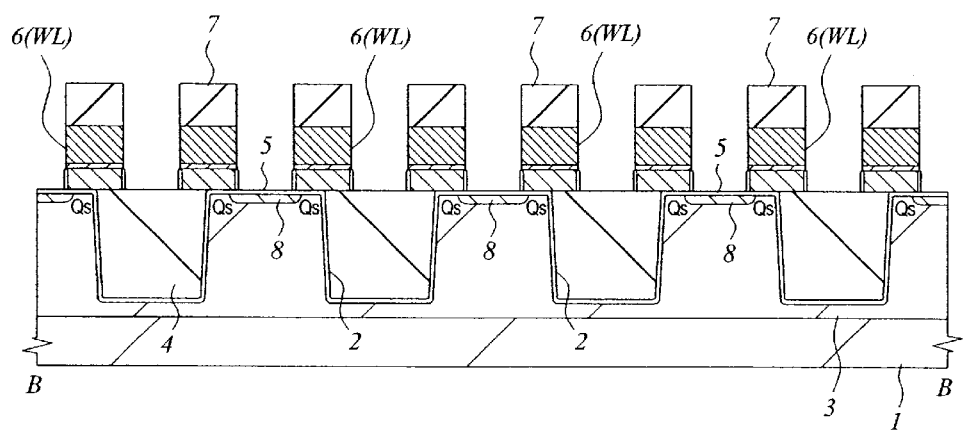
FIG. 9 is a sectional view showing the principal part of a semiconductor substrate, which illustrates a method of manufacturing a DRAM according to an embodiment of the present invention.
Figure 10:
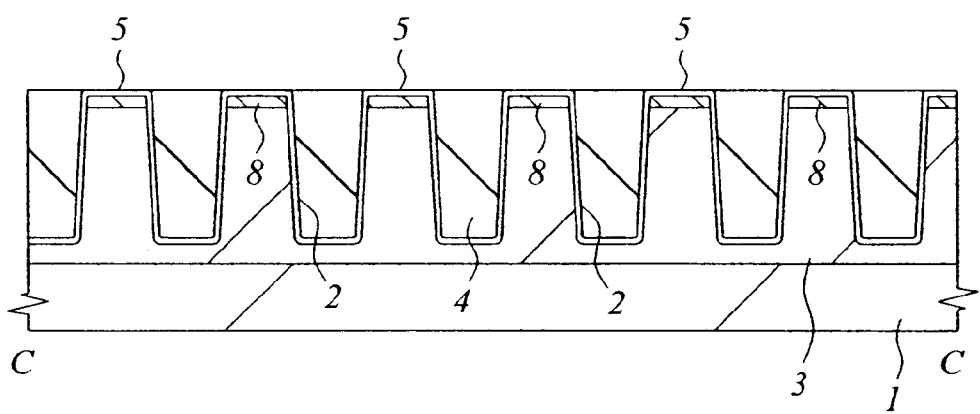
FIG. 10 is a sectional view showing the principal part of a semiconductor substrate, which illustrates a method of manufacturing a DRAM according to an embodiment of the present invention.
Figure 11:
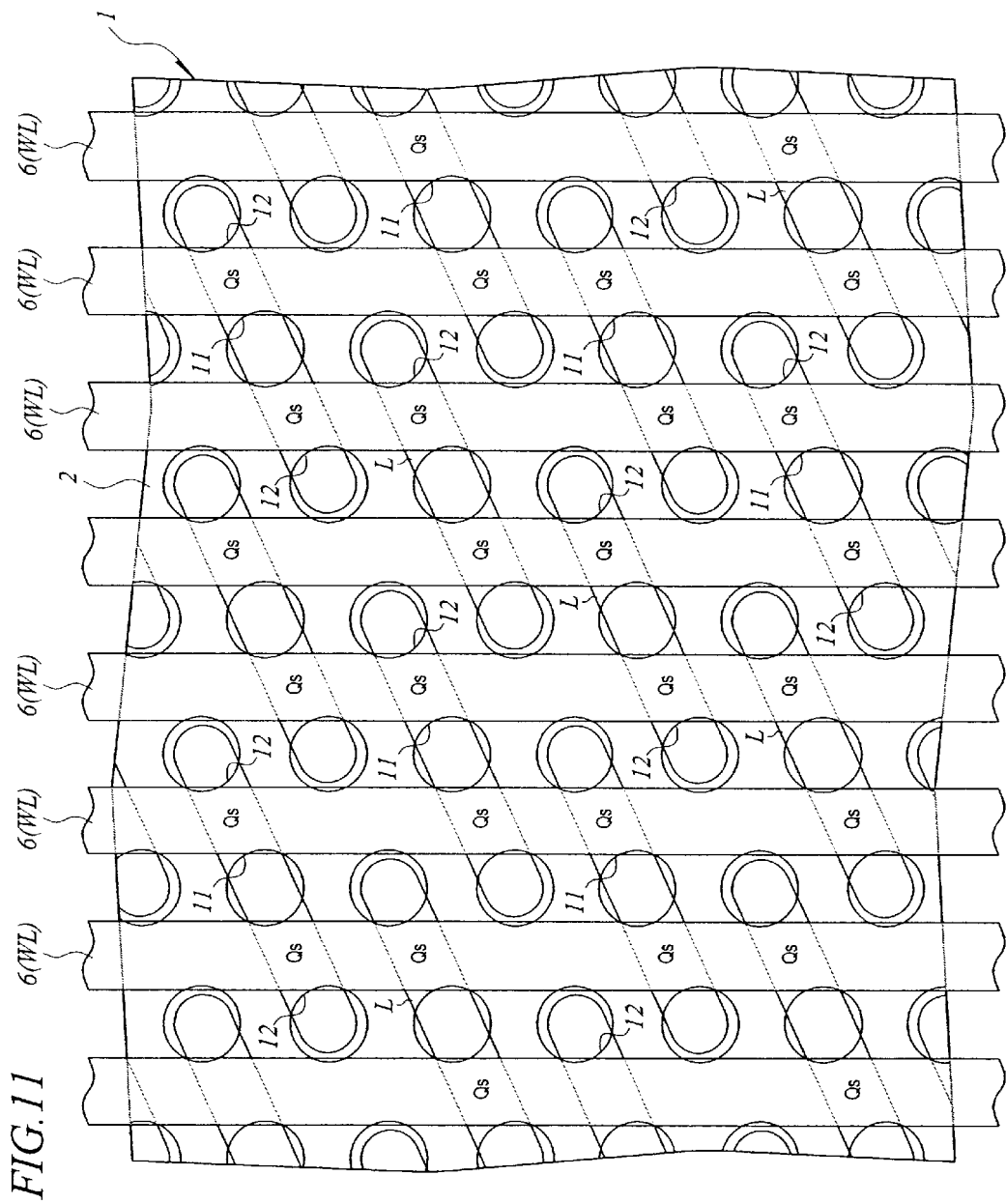
FIG. 11 is a plan view showing the principal part of a semiconductor substrate, which illustrates a method of manufacturing a DRAM according to an embodiment of the present invention.
Figure 12:
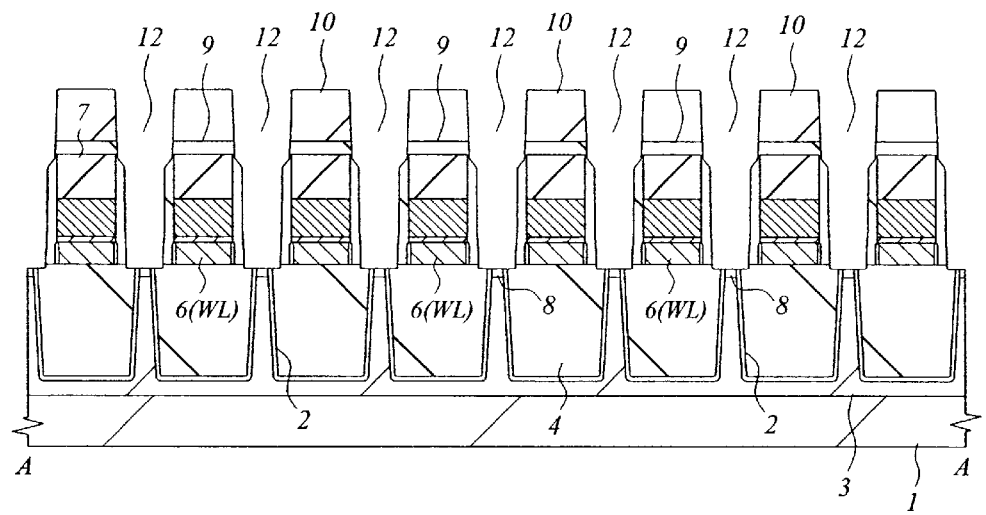
FIG. 12 is a sectional view showing the principal part of a semiconductor substrate, which illustrates a method of manufacturing a DRAM according to an embodiment of the present invention.
Figure 13:
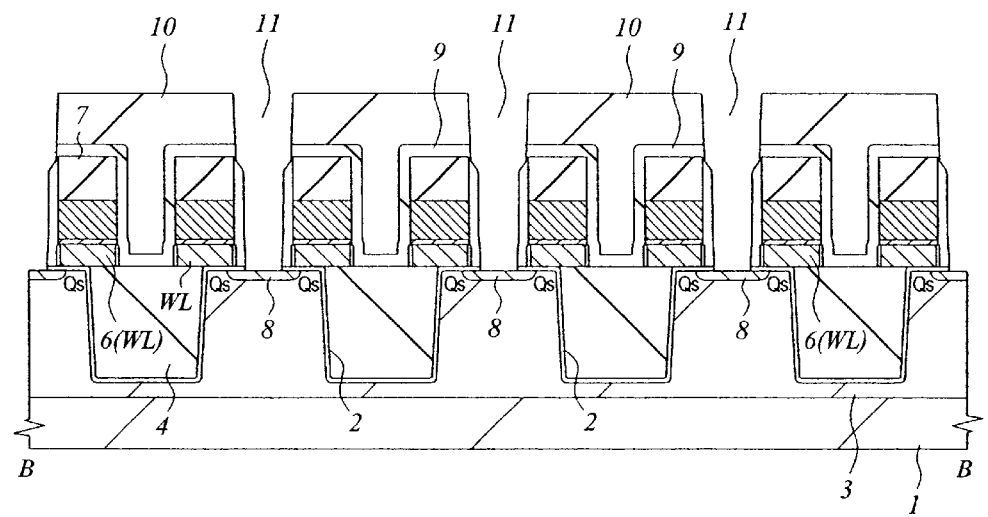
FIG. 13 is a sectional view showing the principal part of a semiconductor substrate, which illustrates a method of manufacturing a DRAM according to an embodiment of the present invention.
Figure 14:
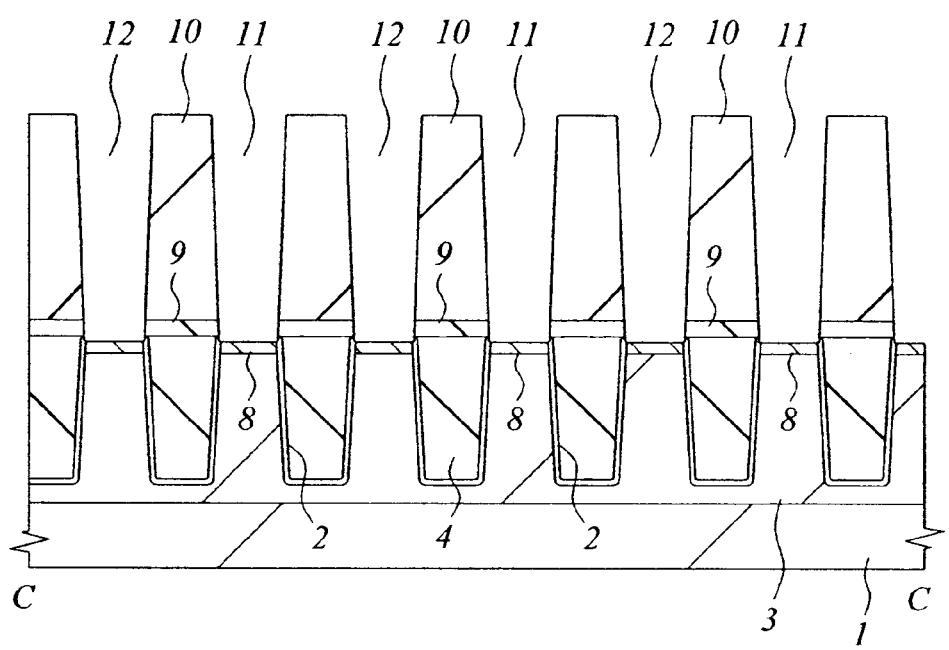
FIG. 14 is a sectional view showing the principal part of a semiconductor substrate, which illustrates a method of manufacturing a DRAM according to an embodiment of the present invention.

Next, as shown in FIGS. 8 to 10, As (arsenic) ions or P (phosphorus) ions are implanted into the p-type well 3 to form n-type semiconductor regions 8 (source and drain) in the p-type well 3 on both sides of the gate electrode 6. Through the steps as mentioned above, the memory cell selecting MISFET Qs is almost completed.

Next, as shown in FIGS. 11 to 14, a silicon nitride film 9 (thickness: 50 nm) and a silicon oxide film 10 (thickness: about 600 nm) are deposited on the resultant structure on the semiconductor substrate 1 by the CVD method. Subsequently, after planarizing the surface of the silicon oxide film 10 by the CMP method, the silicon oxide film 10 and the silicon nitride film 9 are dry-etched with using a photoresist film (not shown) as a mask, thereby forming contact holes 11 and 12 on the source and drain (n-type semiconductor region 8) of the memory cell selecting MISFET Qs. The etching of the silicon oxide film 10 is performed under the condition of high etching selectivity for silicon nitride, and the etching of the silicon nitride film 9 is performed under the condition of high etching selectivity for silicon and silicon oxide. Thus, the contact holes 11 and 12 are formed self-alignedly with the gate electrode 6 (word line WL).

Figure 15:
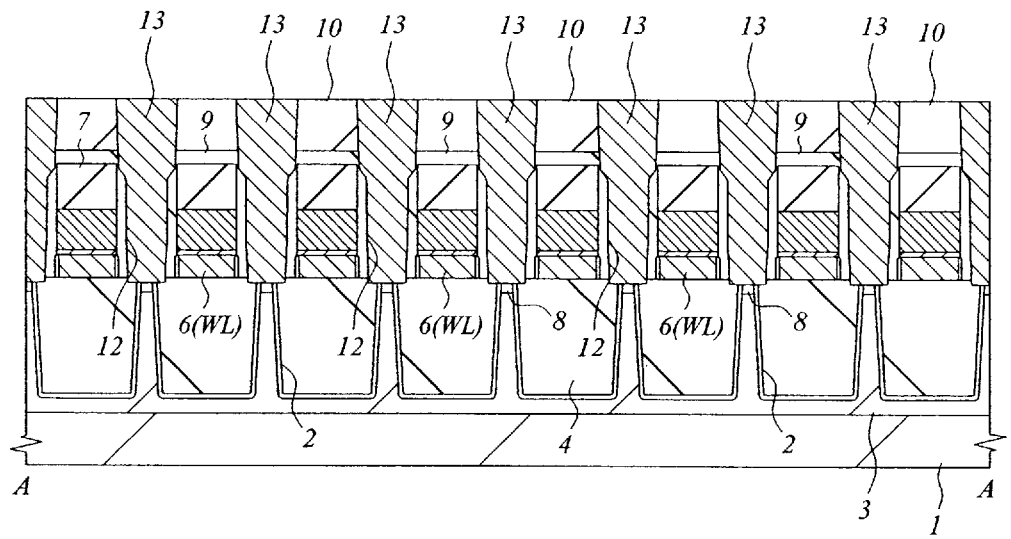
FIG. 15 is a sectional view showing the principal part of a semiconductor substrate, which illustrates a method of manufacturing a DRAM according to an embodiment of the present invention.
Figure 16:
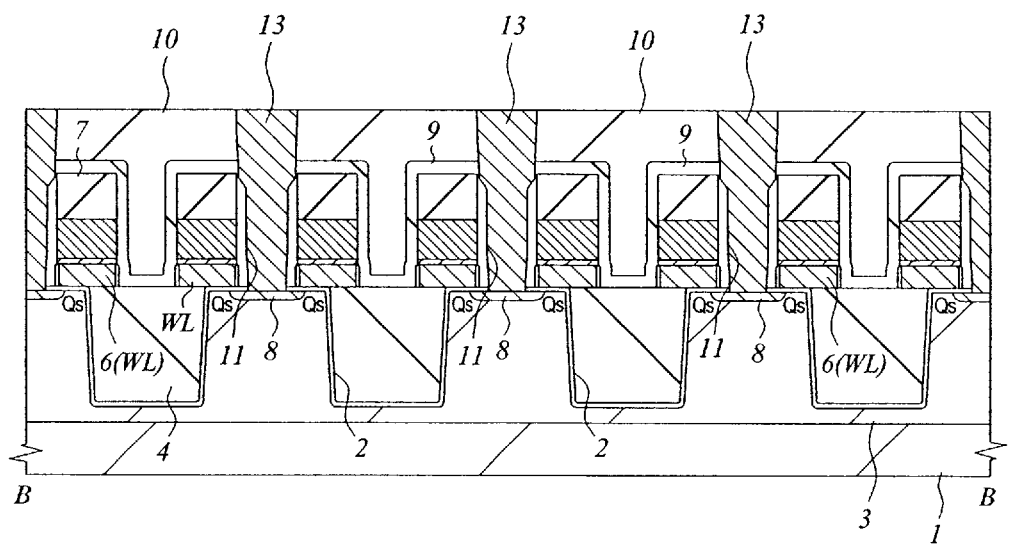
FIG. 16 is a sectional view showing the principal part of a semiconductor substrate, which illustrates a method of manufacturing a DRAM according to an embodiment of the present invention.

Next, plugs 13 are formed in the contact holes 11 and 12 as shown in FIGS. 15 and 16. The plug 13 is formed in such a manner as follows. That is, an n-type polycrystalline silicon film doped with P is deposited on the silicon oxide film 10 by the CVD method, thereby burying the n-type polycrystalline silicon film in the contact holes 11 and 12. Thereafter, the n-type polycrystalline silicon film outside the contact holes 11 and 12 are removed by the CMP method (or dry etching).

Figure 17:
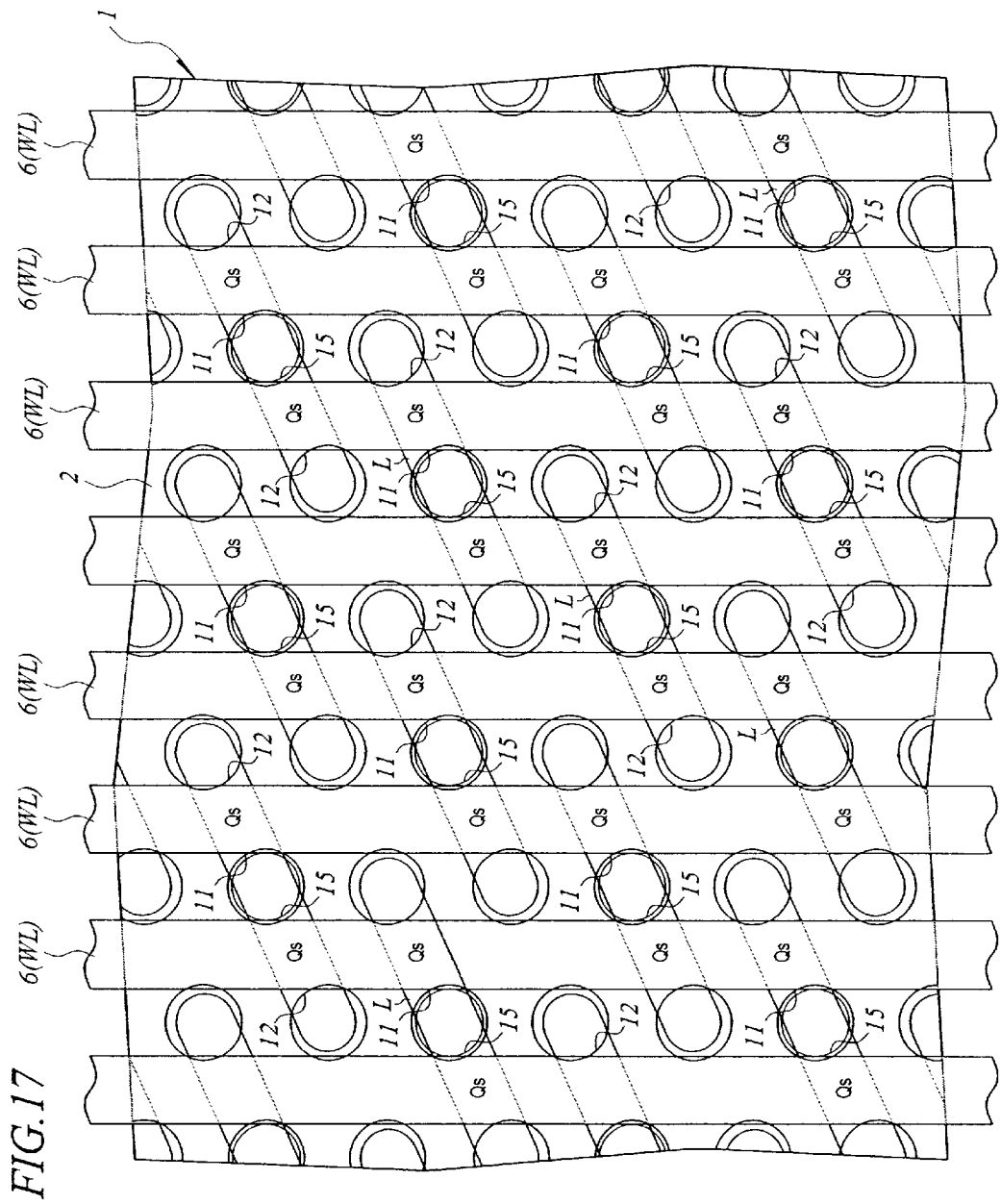
FIG. 17 is a plan view showing the principal part of a semiconductor substrate, which illustrates a method of manufacturing a DRAM according to an embodiment of the present invention.
Figure 18:
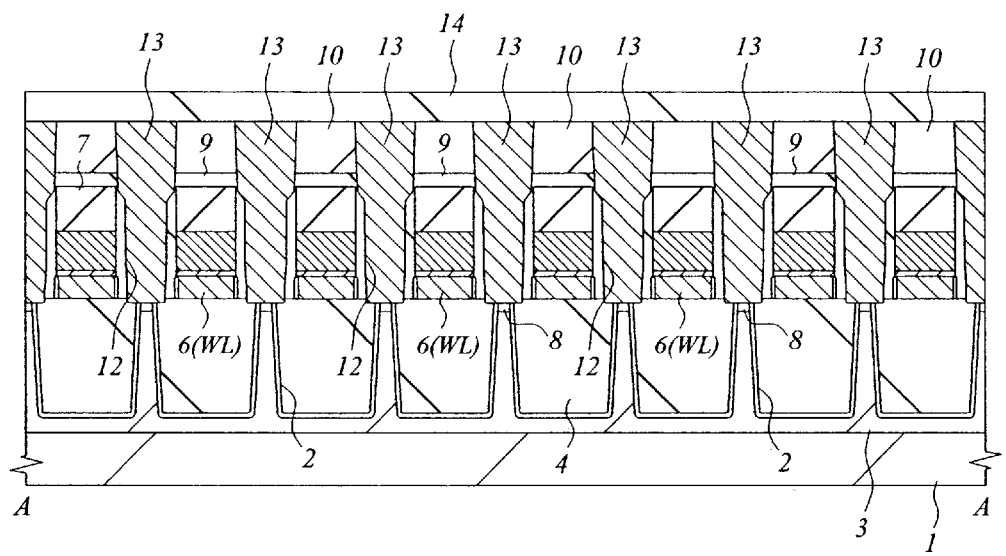
FIG. 18 is a sectional view showing the principal part of a semiconductor substrate, which illustrates a method of manufacturing a DRAM according to an embodiment of the present invention.
Figure 19:
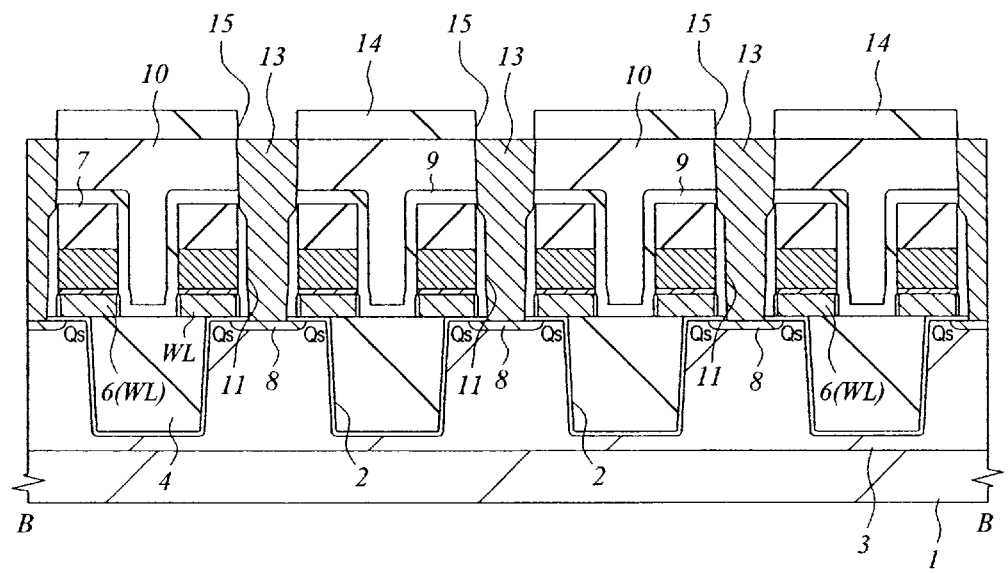
FIG. 19 is a sectional view showing the principal part of a semiconductor substrate, which illustrates a method of manufacturing a DRAM according to an embodiment of the present invention.

Next, a silicon oxide film 14 (thickness: about 150 nm) is deposited on the silicon oxide film 10 by the CVD method. Thereafter, as shown in FIGS. 17 to 19, the silicon oxide film 14 on the contact hole 11 is dry-etched with using a photoresist film (not shown) as a mask, thereby forming a through hole 15 functioning to have the contact hole 11 connected to a bit line (BL) formed in the later process.

Figure 20:
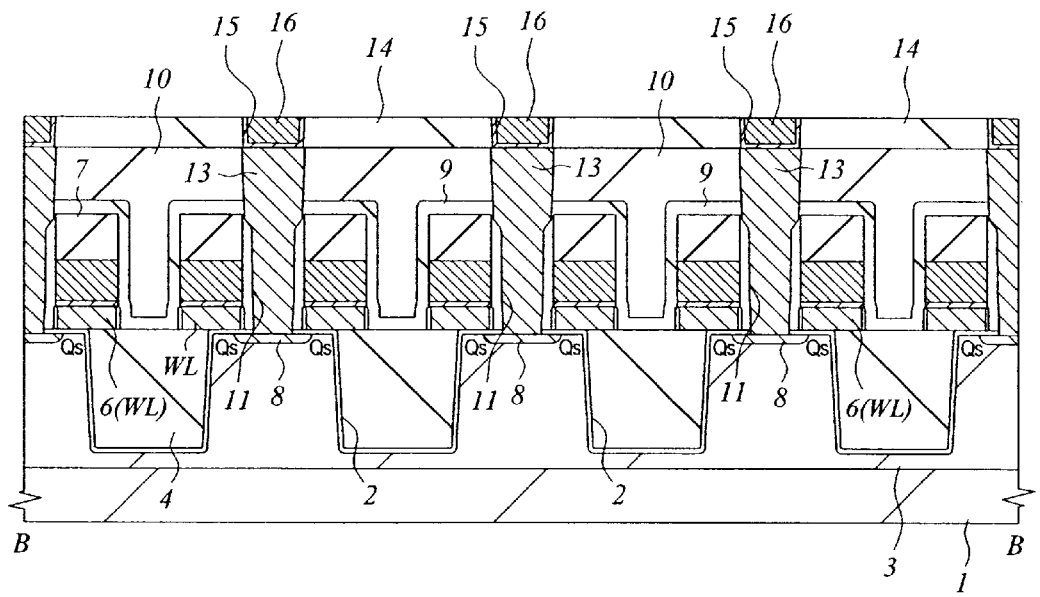
FIG. 20 is a sectional view showing the principal part of a semiconductor substrate, which illustrates a method of manufacturing a DRAM according to an embodiment of the present invention.
Figure 21:
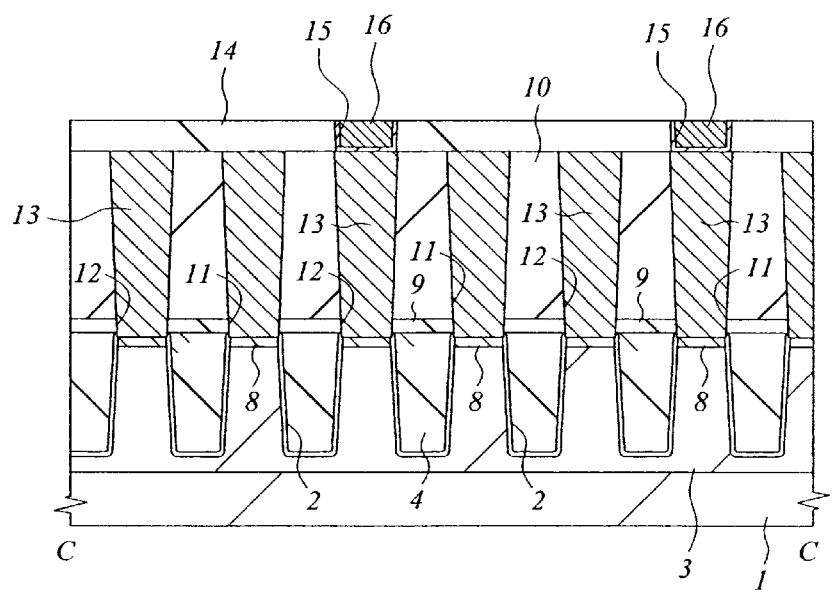
FIG. 21 is a sectional view showing the principal part of a semiconductor substrate, which illustrates a method of manufacturing a DRAM according to an embodiment of the present invention.
Figure 22:
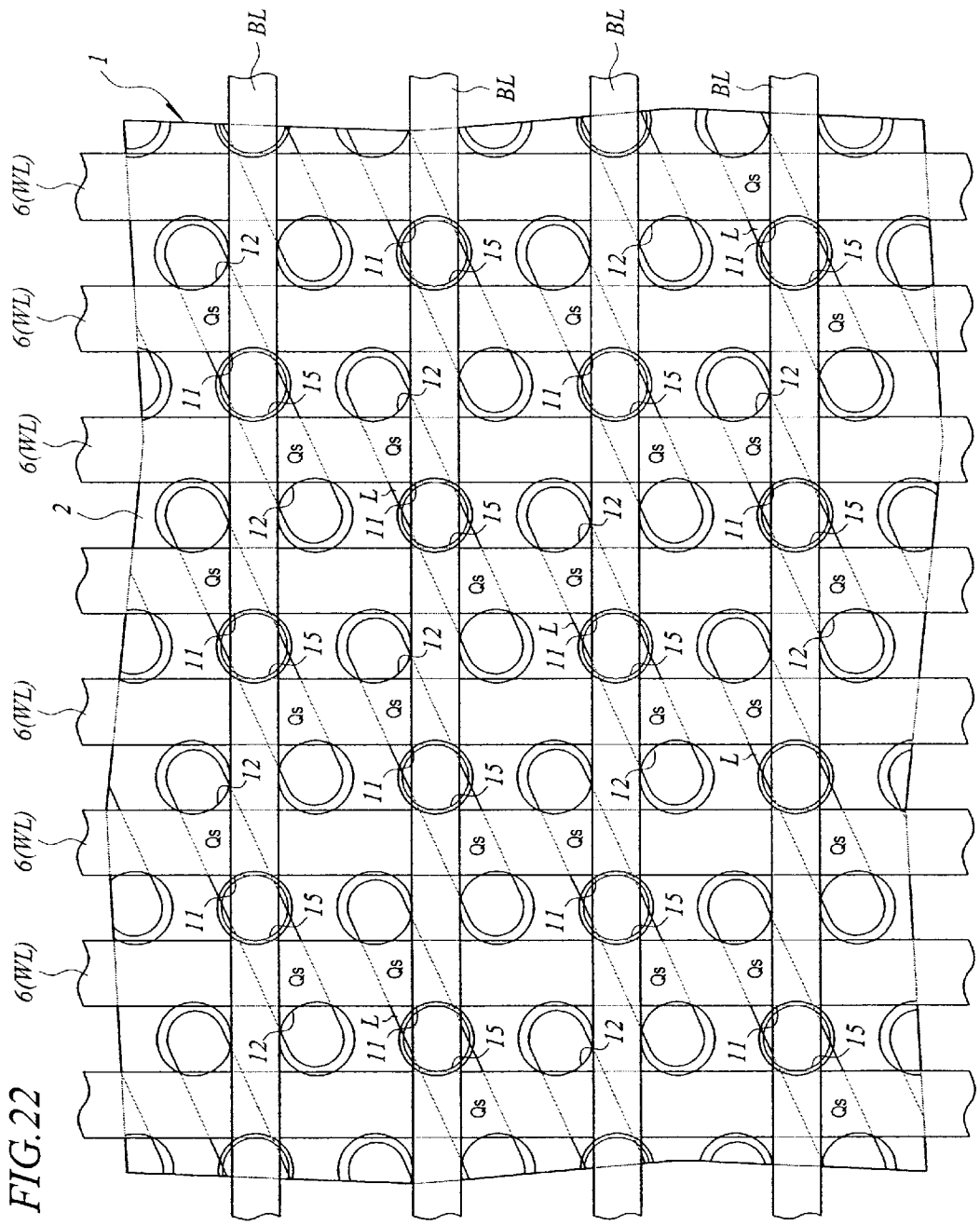
FIG. 22 is a plan view showing the principal part of a semiconductor substrate, which illustrates a method of manufacturing a DRAM according to an embodiment of the present invention.

Next, as shown in FIGS. 20 and 21, a plug 16 is formed in the through hole 15. The plug 16 is formed in such a manner as follows. That is, a barrier metal film made of TiN is deposited on the silicon oxide film 14 by, for example, the sputtering method. Subsequently, a W film is deposited on the barrier metal film by the CVD method to bury these films in the through hole 15. Thereafter, these films outside the through hole 15 are removed by the CMP method.

Figure 23:
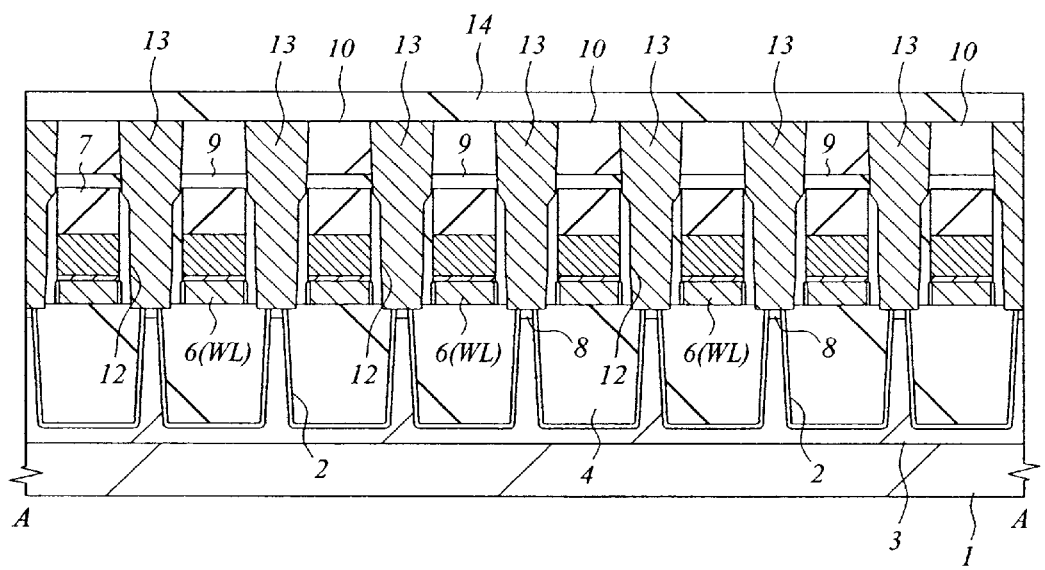
FIG. 23 is a sectional view showing the principal part of a semiconductor substrate, which illustrates a method of manufacturing a DRAM according to an embodiment of the present invention.
Figure 24:
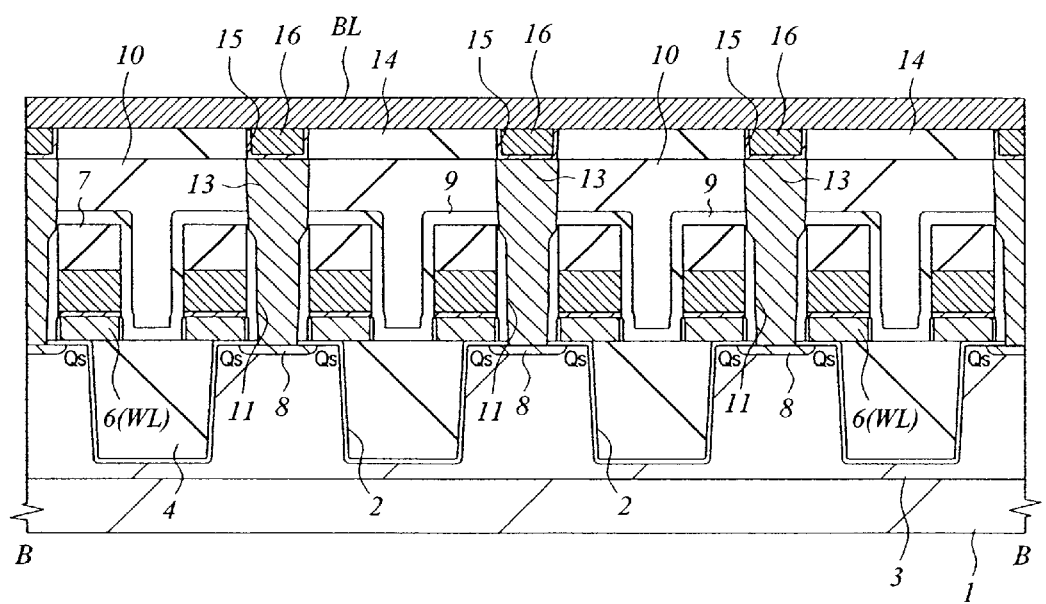
FIG. 24 is a sectional view showing the principal part of a semiconductor substrate, which illustrates a method of manufacturing a DRAM according to an embodiment of the present invention.
Figure 25:
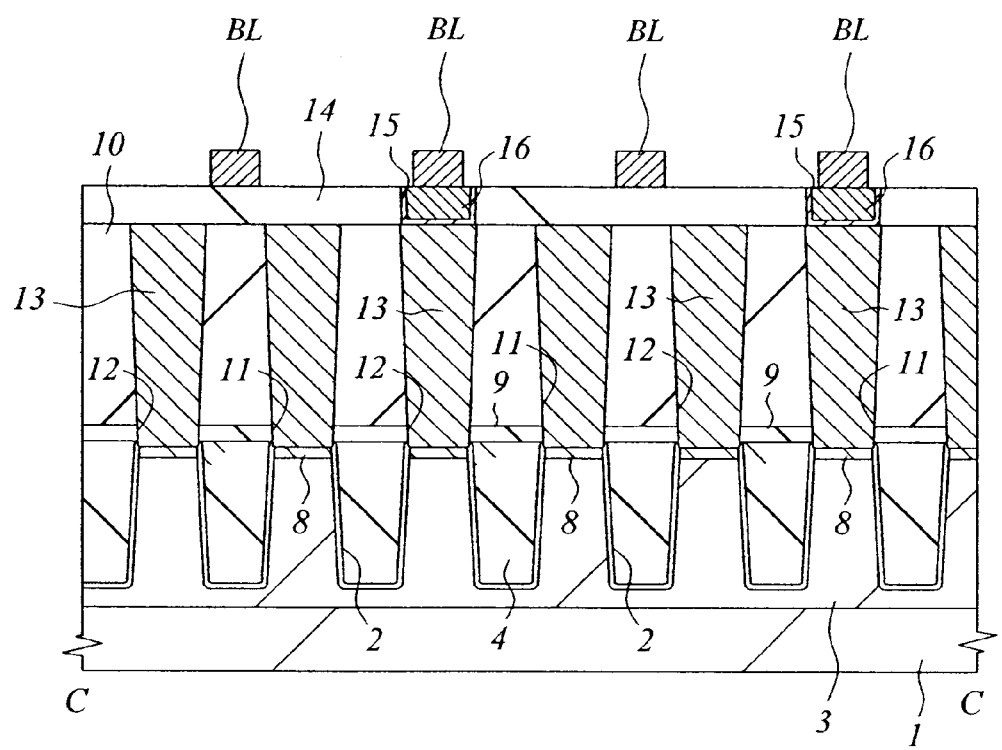
FIG. 25 is a sectional view showing the principal part of a semiconductor substrate, which illustrates a method of manufacturing a DRAM according to an embodiment of the present invention.

Next, as shown in FIGS. 23 to 25, the bit line BL is formed on the silicon oxide film 14. The bit line BL is formed in such a manner as follows. That is, a TiN film (thickness: about 10 nm) is deposited on the silicon oxide film 14 by the sputtering method. Subsequently, a W film (thickness: about 50 nm) is deposited on the TiN film by the CVD method. Thereafter, these films are dry-etched with using a photoresist film as a mask. The bit line BL is electrically connected to one of the source and drain (n-type semiconductor region 8) of the memory cell selecting MISFET Qs via the plug 16 buried in the through hole 15 below the bit line BL and via the plug 13 buried in the contact hole 11 below the plug 16.

Next, as shown in FIGS. 26 to 29, a silicon oxide film 17 (thickness: about 300 nm) and a silicon nitride film 18 (thickness: about 200 nm) are deposited on the bit line BL by the CVD method. Thereafter, the silicon nitride film 18 and the silicon oxide film 17 are dry-etched with using a photoresist film (not shown) as a mask, thereby forming a through hole 19 on the contact hole 11 in which the plug 13 is buried.

The through hole 19 is formed so as to have a diameter smaller than that of the contact hole 12 below it. More specifically, the through hole 19 is formed in such a manner as follows. That is, a polycrystalline silicon film 20 is deposited on the silicon nitride film 18 by the CVD method and subsequently, the polycrystalline silicon film 20 in the region where the through hole 19 is to be formed is dry-etched so as to form a hole. Thereafter, a polycrystalline silicon film (not shown) is further deposited on the polycrystalline silicon film 20. Then, a sidewall spacer 21 is formed on the sidewall of the hole by performing anisotropic etching to the polycrystalline silicon film on the polycrystalline silicon film 20. Subsequently, the silicon nitride film 18 and the silicon oxide film 17 at the bottom of the hole are dry-etched with using the polycrystalline silicon film 20 and the sidewall spacer 21 as masks.

Figure 26:
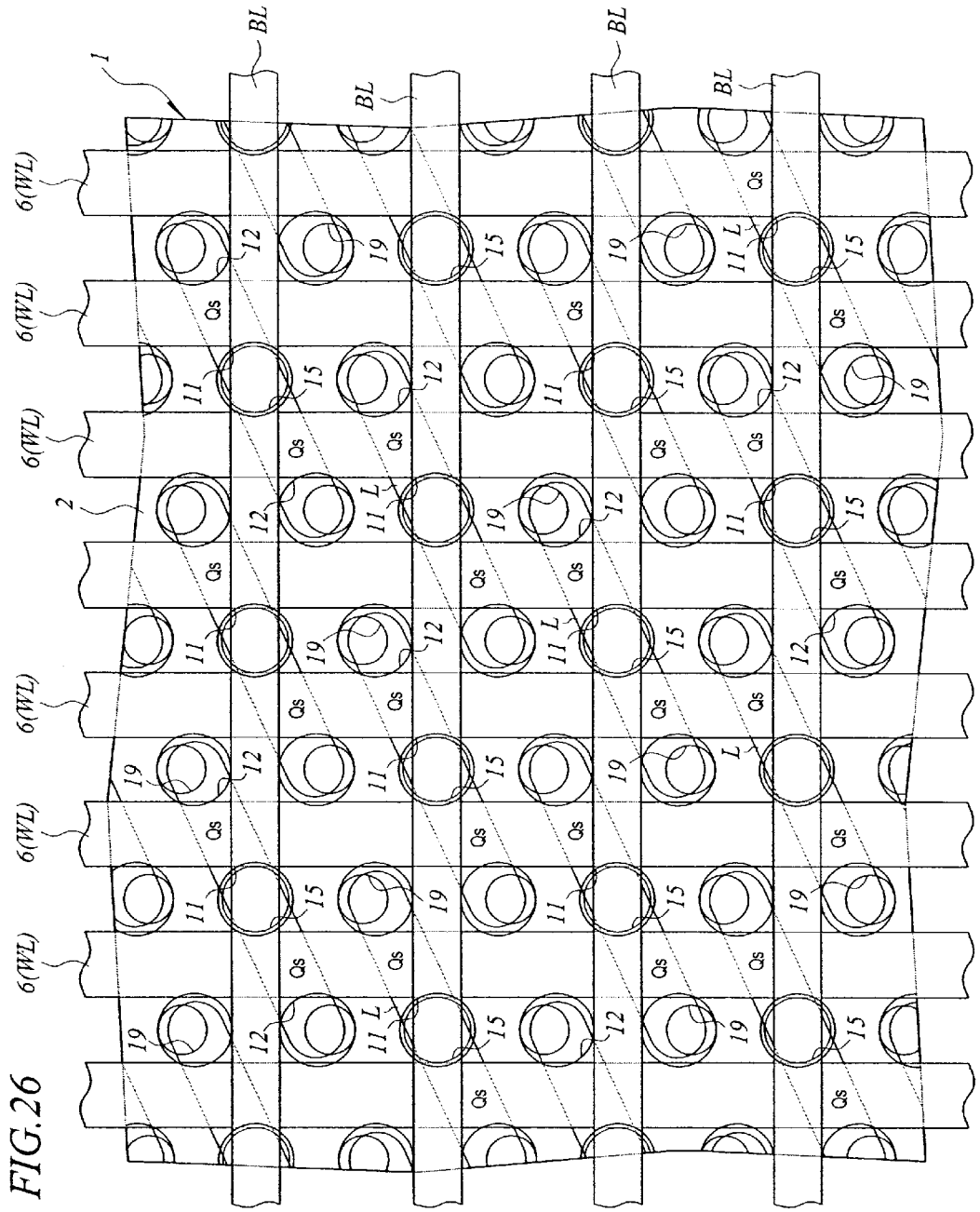
FIG. 26 is a plan view showing the principal part of a semiconductor substrate, which illustrates a method of manufacturing a DRAM according to an embodiment of the present invention.
Figure 27:
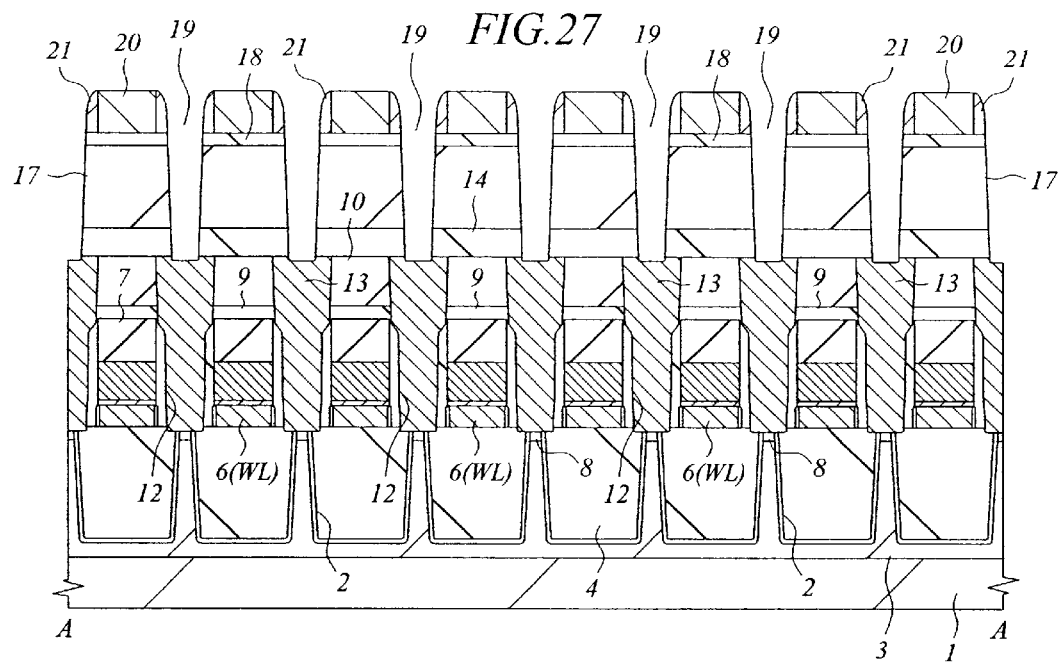
FIG. 27 is a sectional view showing the principal part of a semiconductor substrate, which illustrates a method of manufacturing a DRAM according to an embodiment of the present invention.
Figure 28:
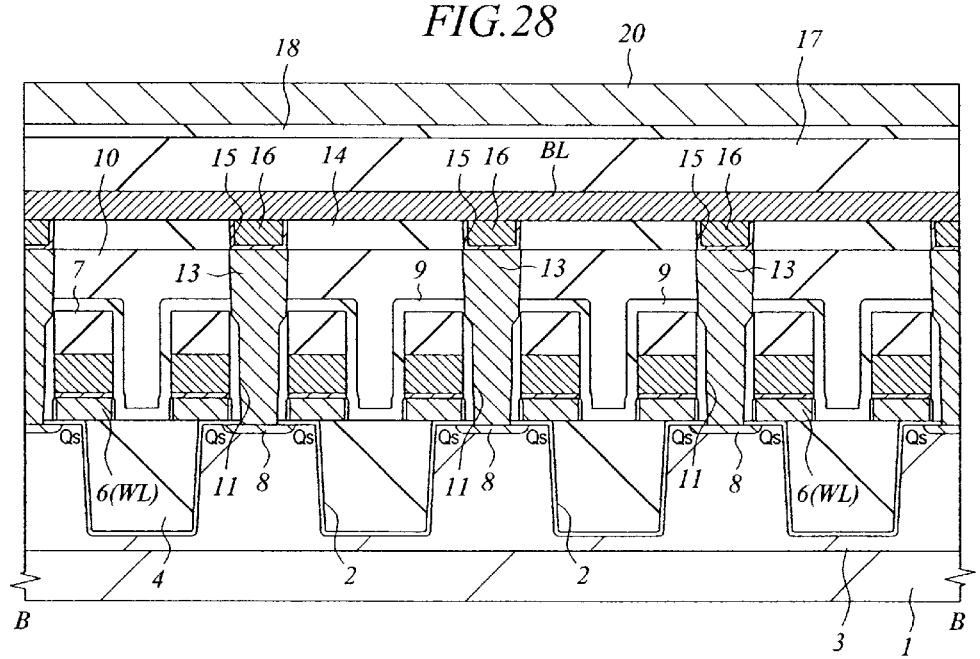
FIG. 28 is a sectional view showing the principal part of a semiconductor substrate, which illustrates a method of manufacturing a DRAM according to an embodiment of the present invention.
Figure 29:
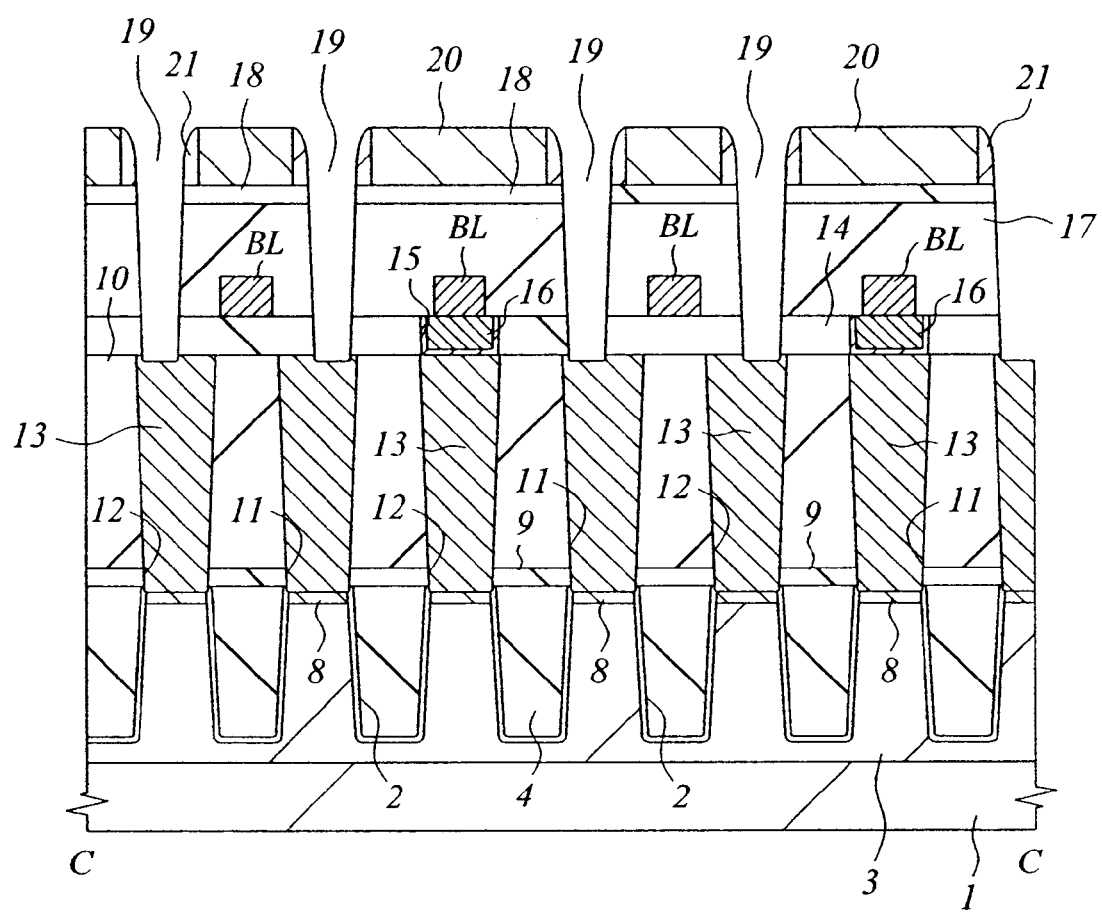
FIG. 29 is a sectional view showing the principal part of a semiconductor substrate, which illustrates a method of manufacturing a DRAM according to an embodiment of the present invention.

Also, as shown in FIGS. 26 and 29, the center of the through hole 19 is offset from that of the contact hole 11 below it in the direction away from the bit line BL. As described above, the diameter of the through hole 19 is made smaller than that of the contact hole 11 below it and the center of the through hole 19 is offset in the direction away from the bit line BL, whereby a short-circuit between the through hole 19 (plug 22 buried in the through hole 19) and the bit line BL can be prevented without using the self-aligned contact (SAC) technique even in the case where the memory size is reduced. In addition, since the diameter of the through hole 19 is made smaller than that of the contact hole 11 below it, the contact area therebetween can be surely obtained even if the centers thereof are offset from each other.

Figure 30:
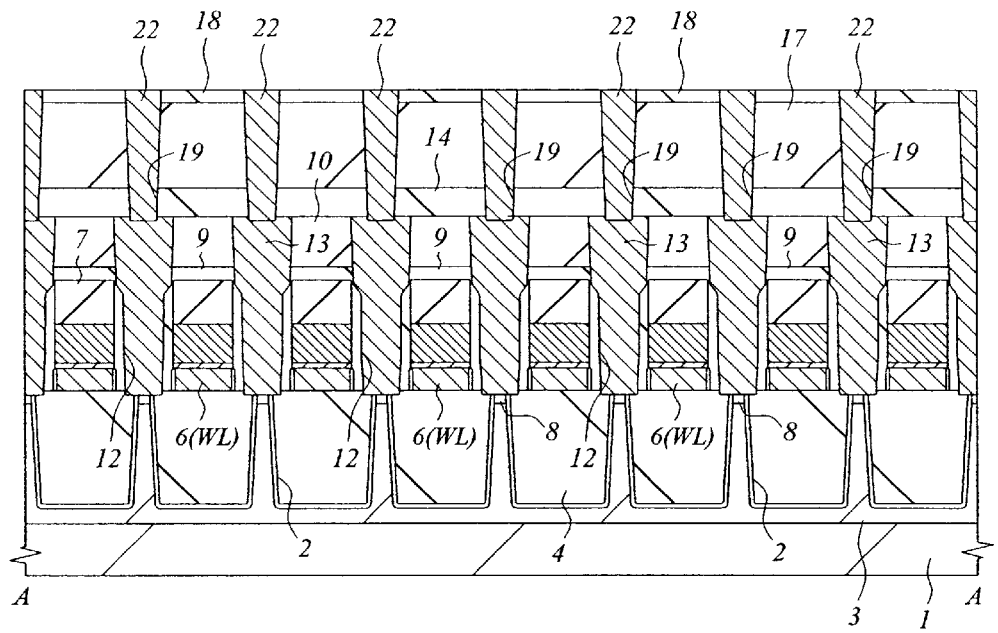
FIG. 30 is a sectional view showing the principal part of a semiconductor substrate, which illustrates a method of manufacturing a DRAM according to an embodiment of the present invention.
Figure 31:
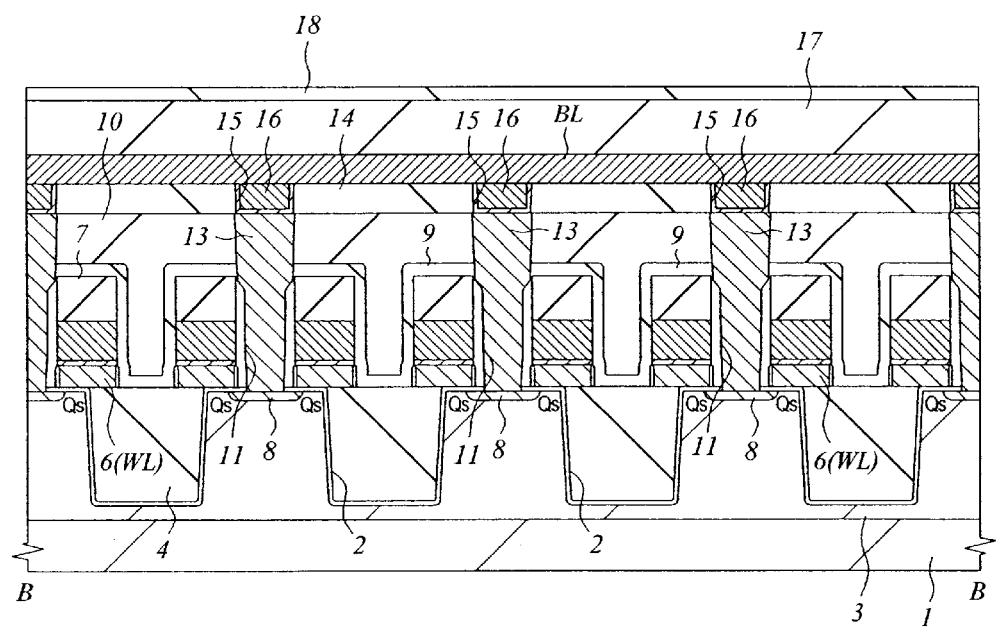
FIG. 31 is a sectional view showing the principal part of a semiconductor substrate, which illustrates a method of manufacturing a DRAM according to an embodiment of the present invention.
Figure 32:
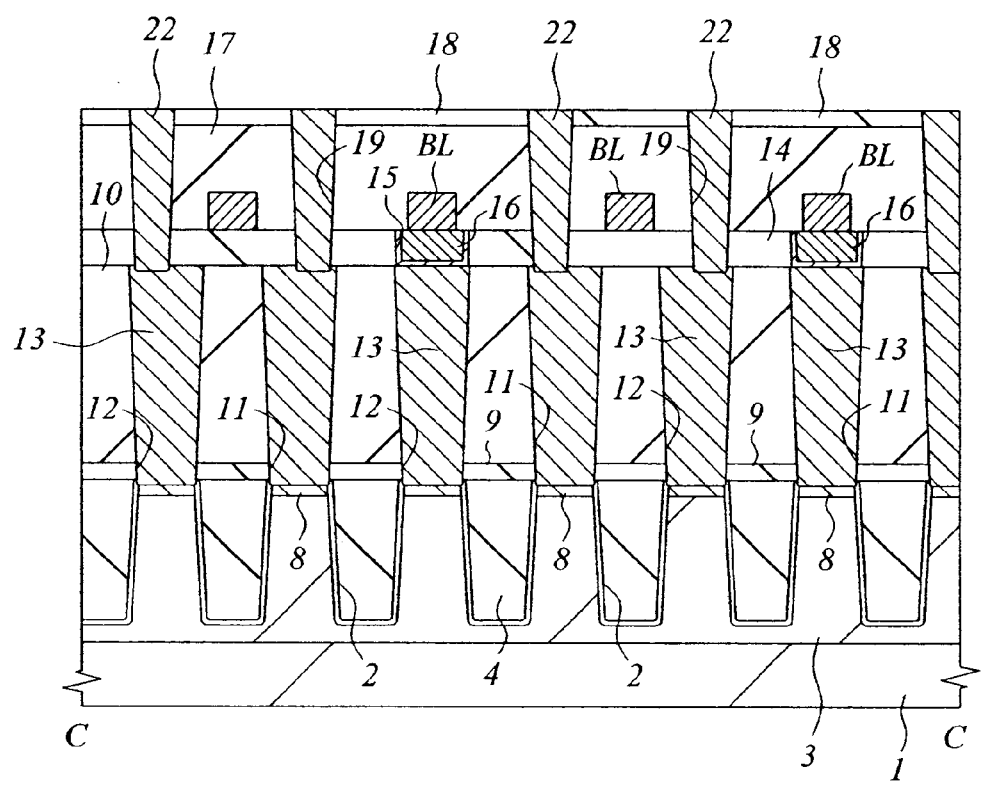
FIG. 32 is a sectional view showing the principal part of a semiconductor substrate, which illustrates a method of manufacturing a DRAM according to an embodiment of the present invention.

Next, after the masks (polycrystalline silicon film 20 and sidewall spacer 21) used in the formation of the through hole 19 are removed by dry etching, a plug 22 is formed in the through hole 19 as shown in FIGS. 30 to 32. The plug 22 is formed in such a manner as follows. That is, an n-type polycrystalline silicon film doped with P is deposited on the silicon nitride film 18 by the CVD method, thereby burying the n-type polycrystalline silicon film in the through hole 19. Subsequently, the n-type polycrystalline silicon film outside the through hole 19 is removed by the CMP method (or dry etching).

Figure 33:
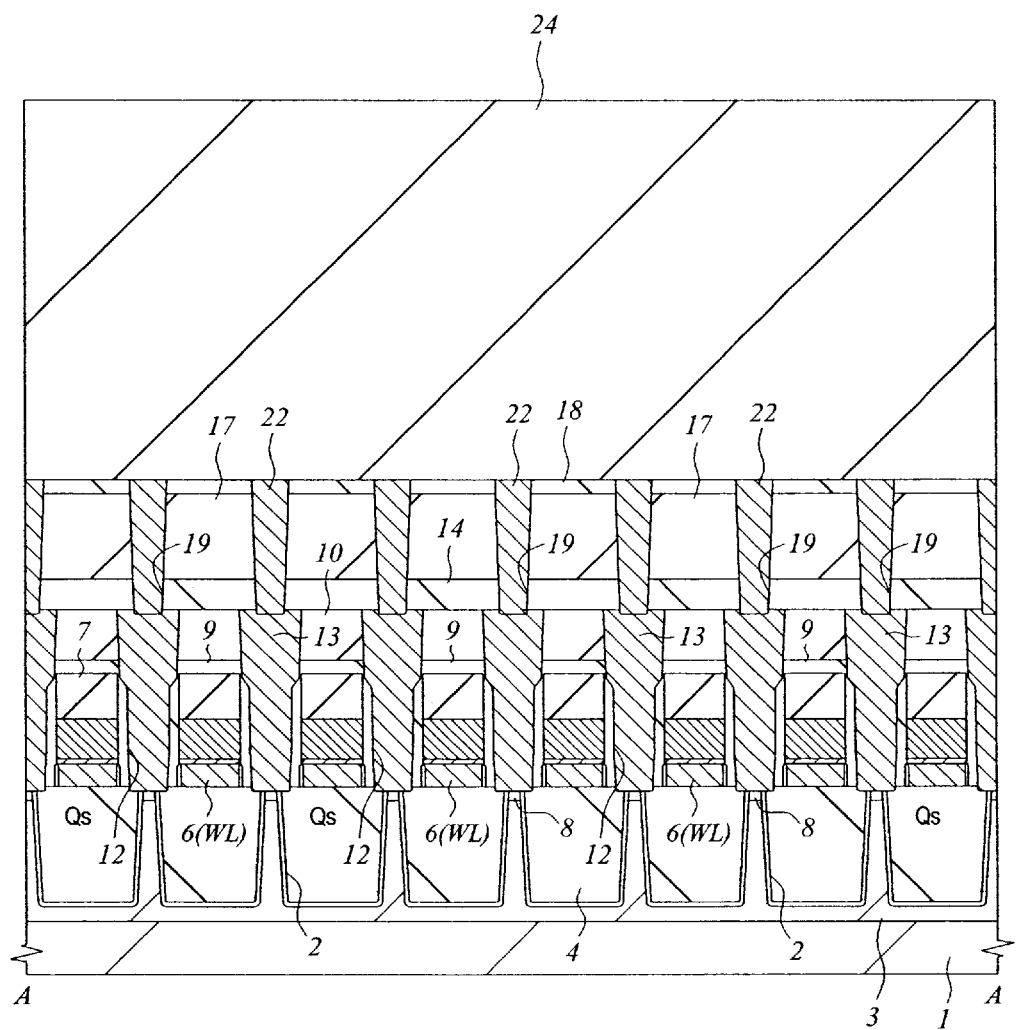
FIG. 33 is a sectional view showing the principal part of a semiconductor substrate, which illustrates a method of manufacturing a DRAM according to an embodiment of the present invention.
Figure 34:
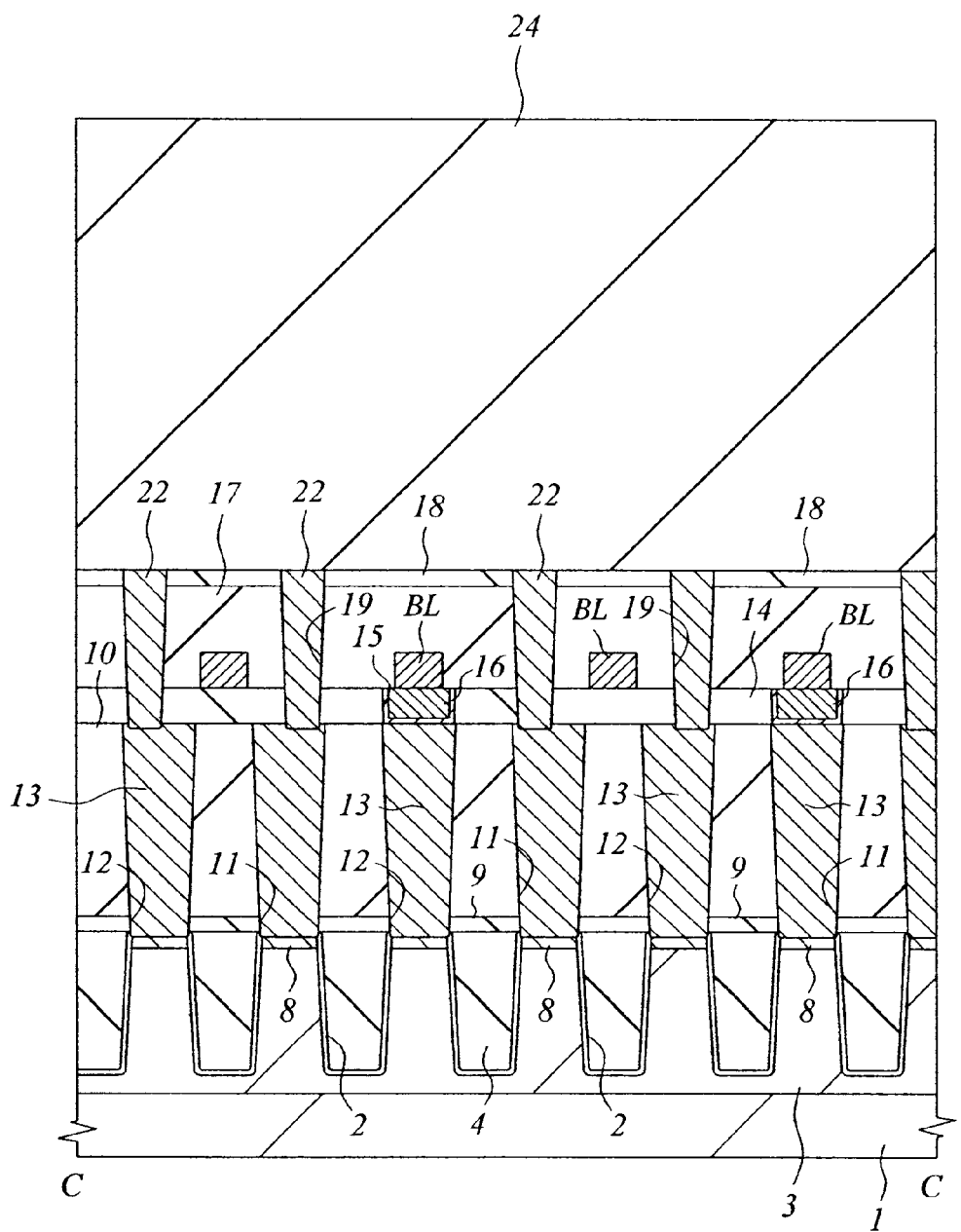
FIG. 34 is a sectional view showing the principal part of a semiconductor substrate, which illustrates a method of manufacturing a DRAM according to an embodiment of the present invention.

Next, as shown in FIGS. 33 and 34, a silicon oxide film 24 with a thickness of about 1500 nm is deposited on the silicon nitride film 18 by the CVD method. A lower electrode 28 of the data storage capacitor C is formed in a trench 27 in the silicon oxide film 24, which is formed in the next process. Therefore, since the thickness of the silicon oxide film 24 corresponds to the height of the lower electrode 28, it is required to thickly deposit the silicon oxide film 24 in order to increase the surface area of the lower electrode 28 and to increase the stored charge. The silicon oxide film 24 is deposited by, for example, the plasma CVD method using oxygen and tetraethoxysilane (TEOS) as source gas. Thereafter, the surface thereof is planarized by the CMP method if necessary.

Figure 35:
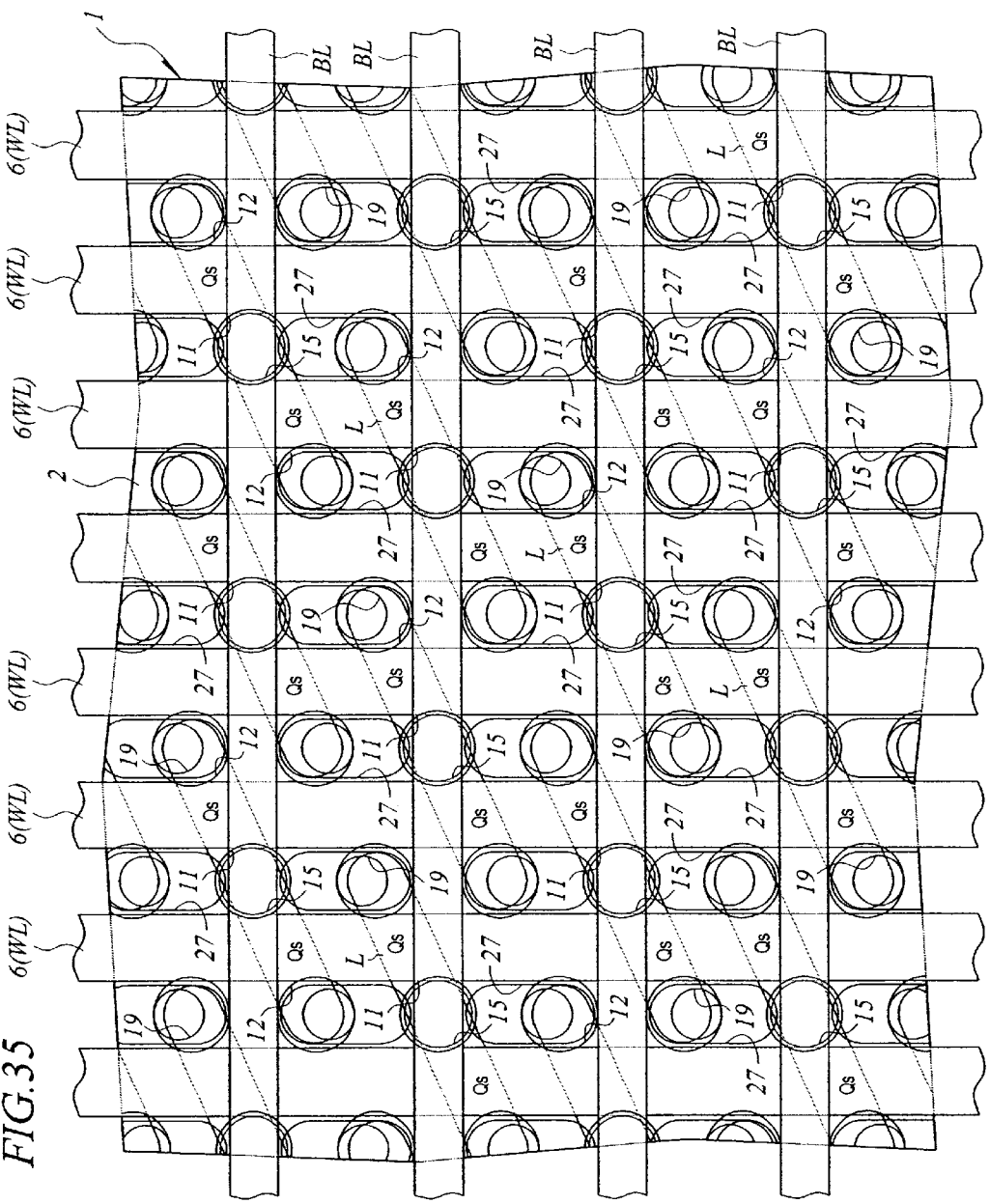
FIG. 35 is a plan view showing the principal part of a semiconductor substrate, which illustrates a method of manufacturing a DRAM according to an embodiment of the present invention.
Figure 36:
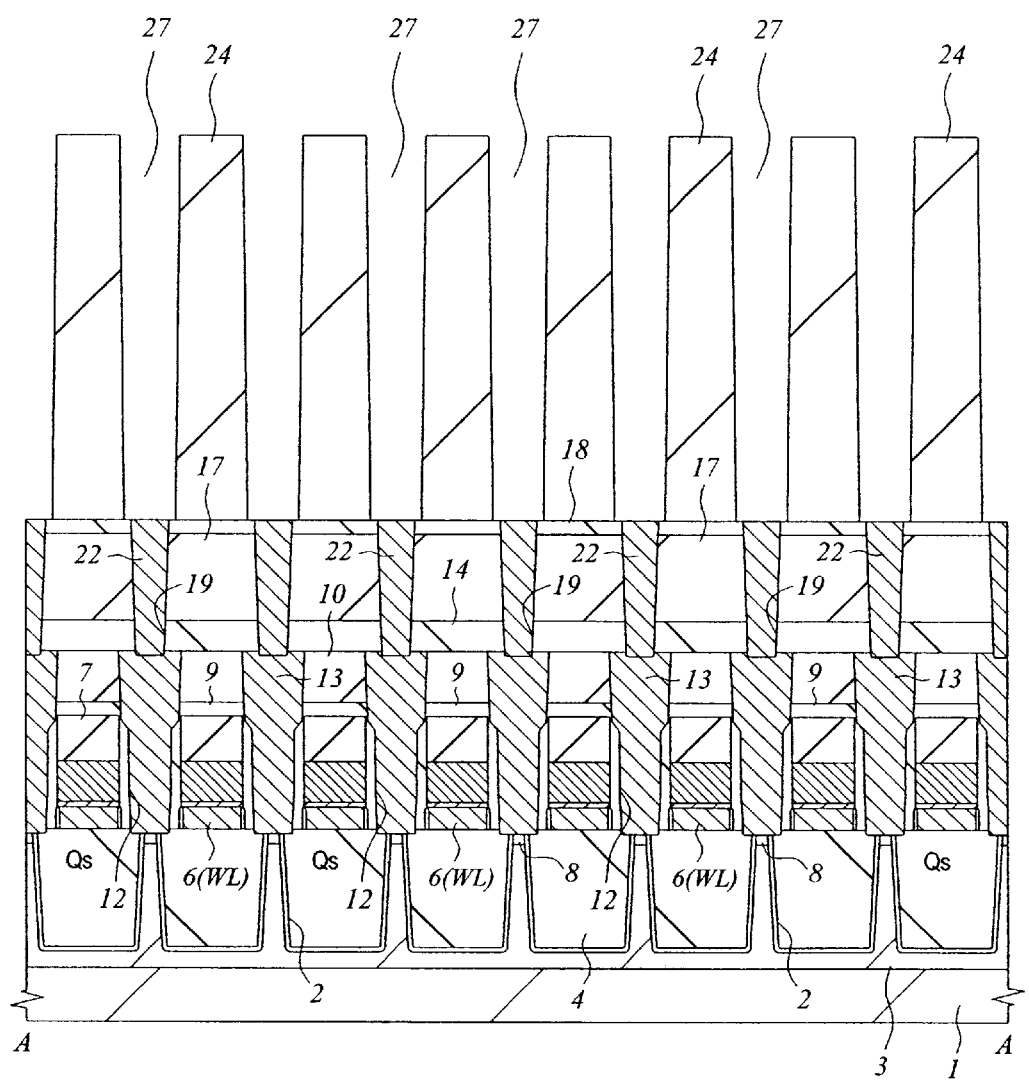
FIG. 36 is a sectional view showing the principal part of a semiconductor substrate, which illustrates a method of manufacturing a DRAM according to an embodiment of the present invention.
Figure 37:
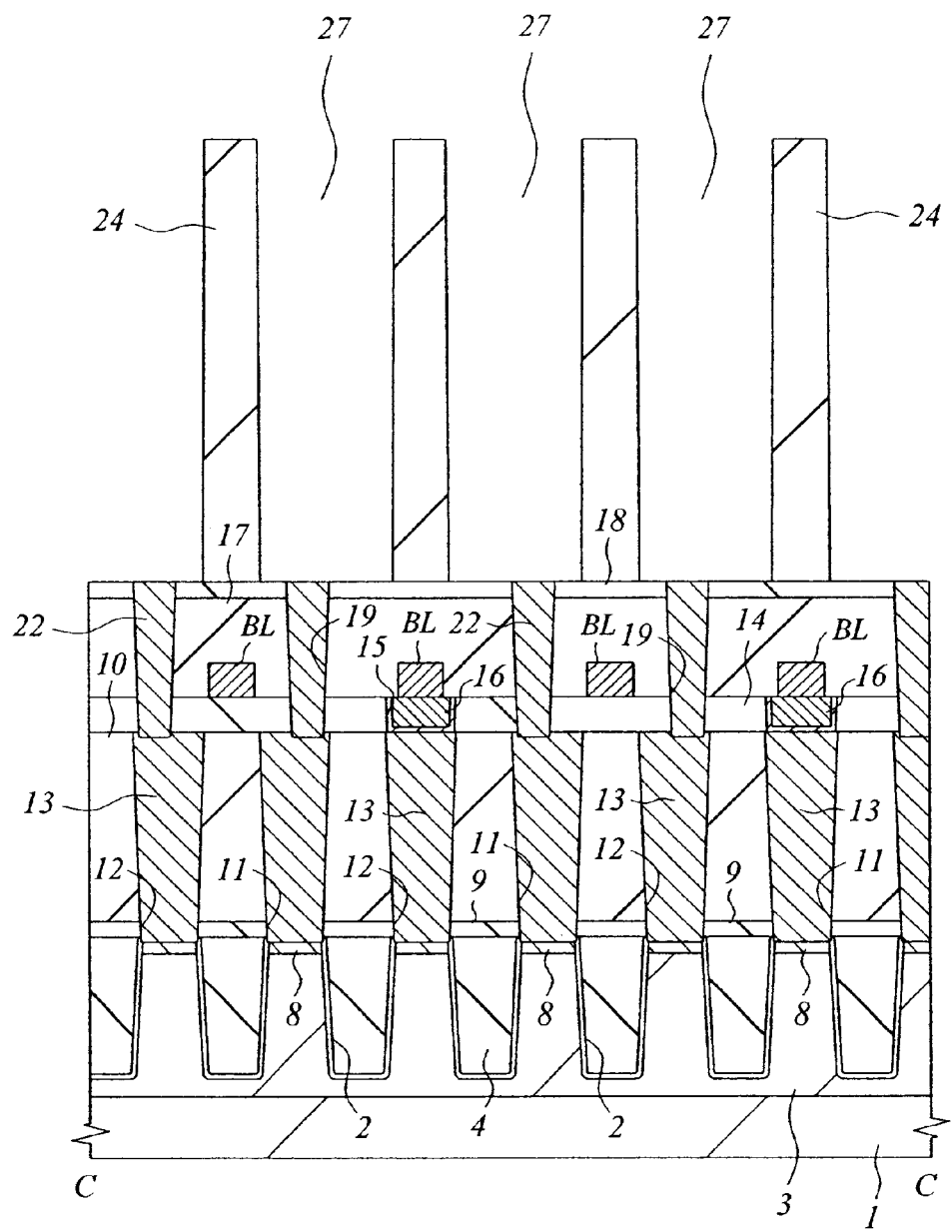
FIG. 37 is a sectional view showing the principal part of a semiconductor substrate, which illustrates a method of manufacturing a DRAM according to an embodiment of the present invention.

Next, as shown in FIGS. 35 to 37, the silicon oxide film 24 is dry-etched with using a photoresist film (not shown) as a mask, thereby forming a trench 27, on the bottom surface of which the surface of the plug 22 in the through hole 19 is exposed. As shown in FIG. 35, the trench 27 has a rectangular plane pattern with the longer side along the word line WL and the shorter side along the bit line BL.

Figure 38:
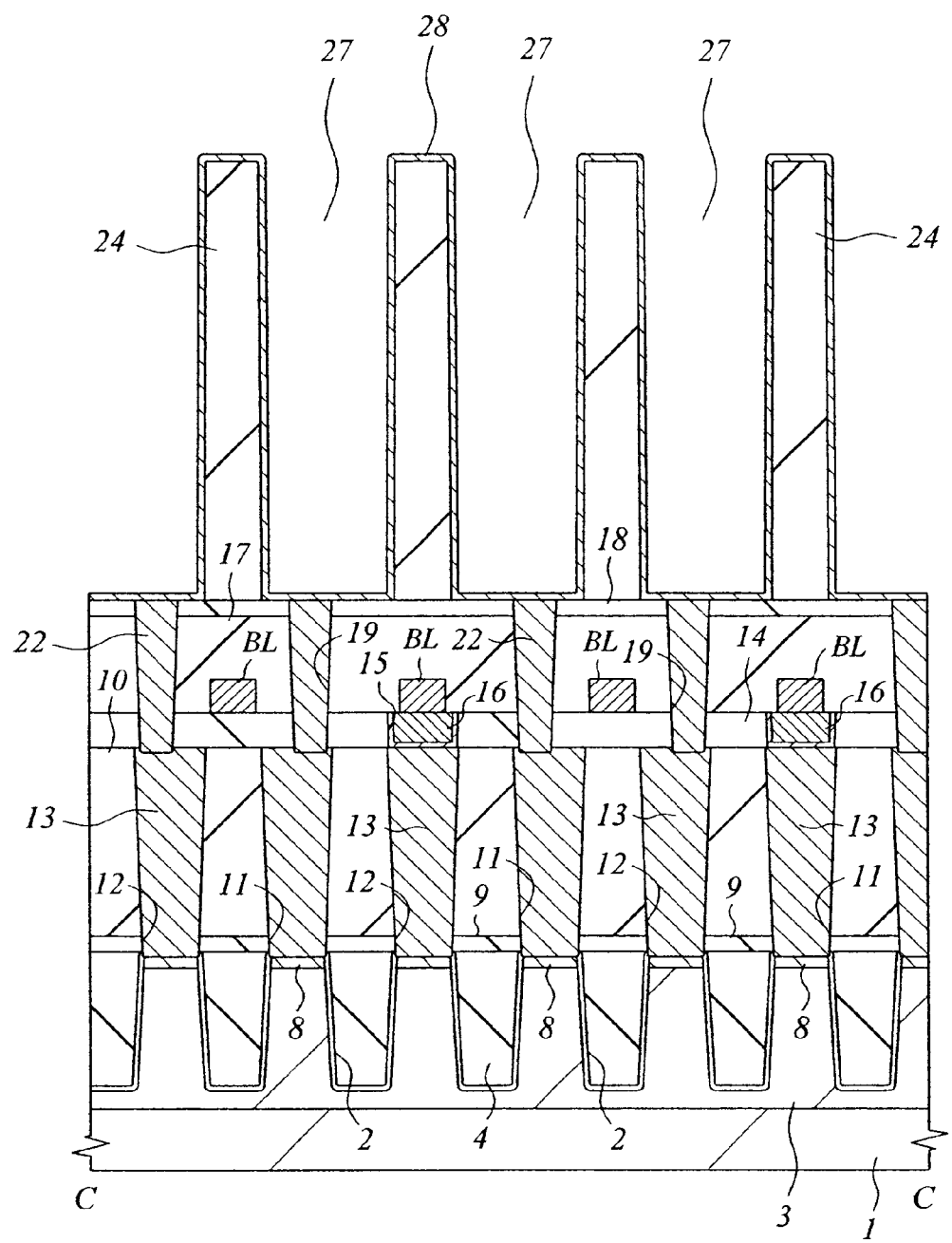
FIG. 38 is a sectional view showing the principal part of a semiconductor substrate, which illustrates a method of manufacturing a DRAM according to an embodiment of the present invention.

Next, as shown in FIG. 38, a thin polycrystalline silicon film 28 is deposited by the CVD method on the silicon oxide film 24 having the trench 27 formed therein. In this case, the polycrystalline silicon film 28 is thinly formed (e.g., about 10 nm) so as not to fill the trench 27. In order to reduce the electric resistance of the polycrystalline silicon film 28, the conductive type of the polycrystalline silicon film 28 is n-type obtained by doping P into the polycrystalline silicon film 28 during the deposition thereof. Also, it is preferable that the polycrystalline silicon film 28 is deposited in an amorphous state, and then polycrystallized by the thermal treatment.

Figure 39:
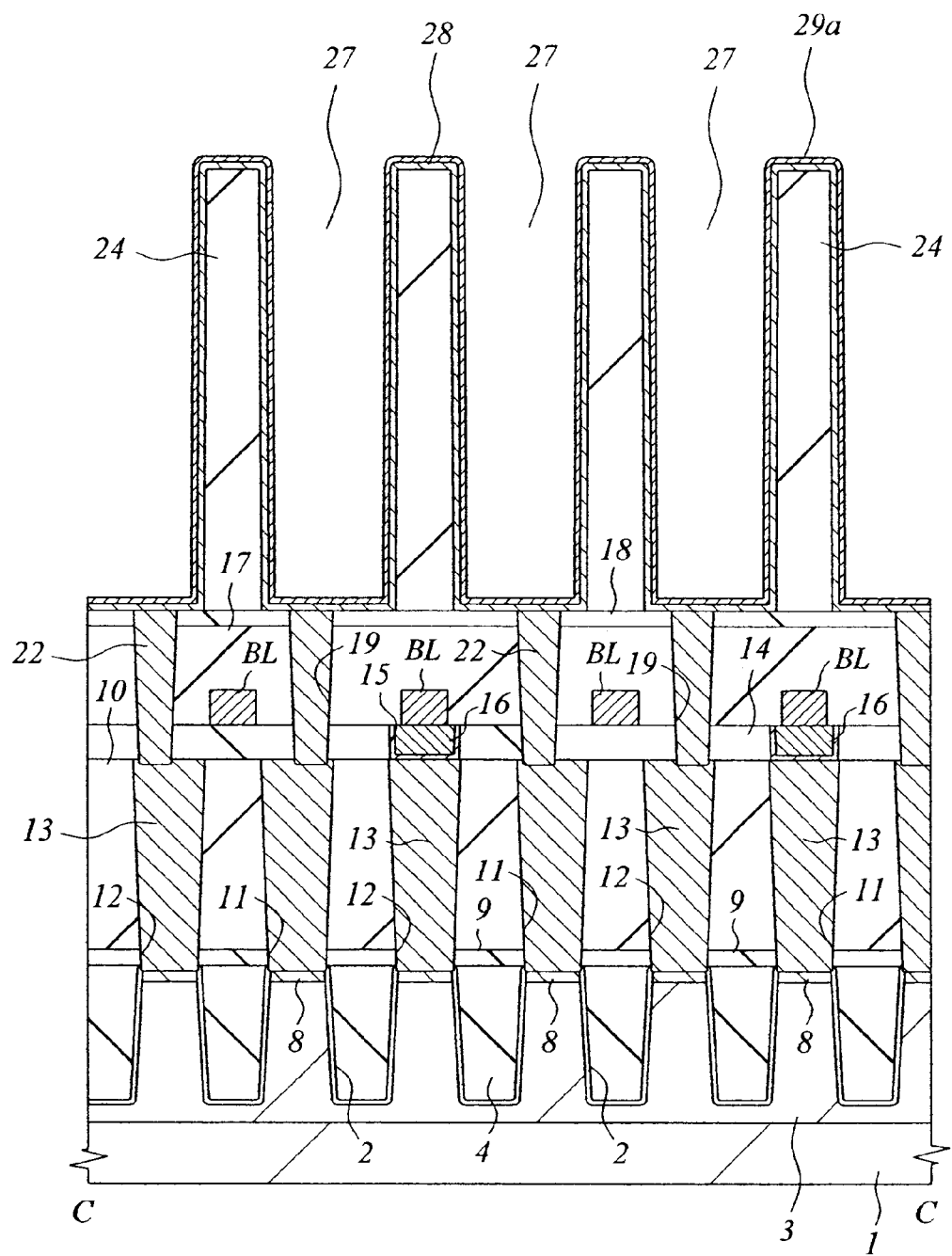
FIG. 39 is a sectional view showing the principal part of a semiconductor substrate, which illustrates a method of manufacturing a DRAM according to an embodiment of the present invention.

Next, as shown in FIG. 39, an Ru film 29a with a thickness of about 20 nm is deposited on the polycrystalline silicon film 28 by the CVD method. The Ru film 29a is formed in such a manner as follows. That is, organic ruthenium compound such as that made by dissolving ethylcyclopentadienyl ruthenium (hereinafter, abbreviated as Ru(EtCp)$_2$) into an organic solvent of tetrahydrofuran (THF) or the like is vaporized at about 250° C., and then is decomposed by oxygen. The Ru film 29a is thinly (e.g., about 20 nm) formed so as not to fill the trench 27. In addition, the deposition of a thin (e.g., about 5 nm) Ru film on the polycrystalline silicon film 28 by the sputtering method in advance of the deposition of the Ru film 29a makes it possible to appropriately deposit the Ru film 29a.

Figure 40:
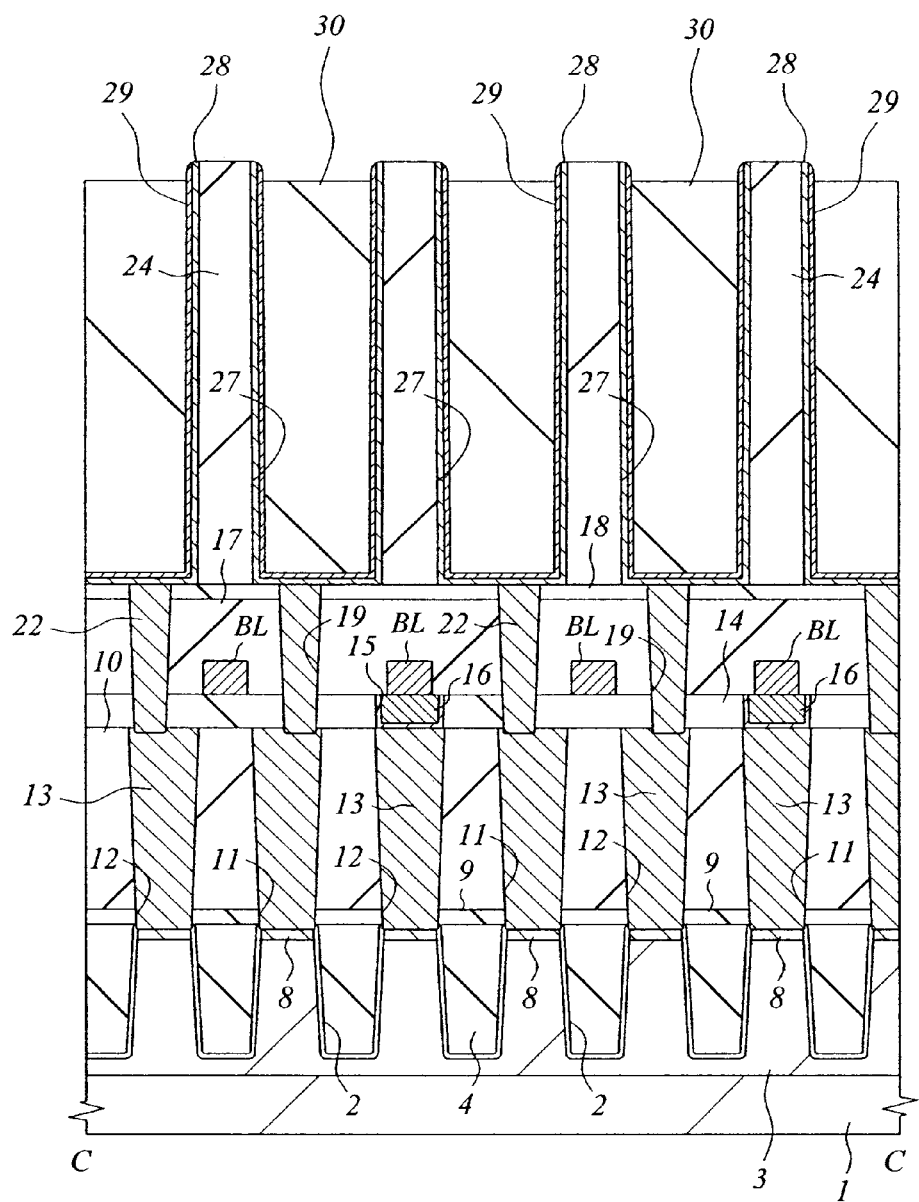
FIG. 40 is a sectional view showing the principal part of a semiconductor substrate, which illustrates a method of manufacturing a DRAM according to an embodiment of the present invention.

Next, as shown in FIG. 40, an insulating film 30 is buried into the trench 27, and parts of the polycrystalline silicon film 28 and the Ru film 29a not covered with the insulating film 30 are removed by dry etching. By doing so, a lower electrode 29 of a data storage capacitor constituted by the Ru film 29a is formed in the trench 27, in other words, on the sidewall and bottom surface of the trench 27. Also, the polycrystalline silicon film 28 electrically connected to the plug 22 in the through hole 19 is left between the sidewall and bottom surface of the trench 27 and the lower electrode 29.

The insulating film 30 is made of an insulating material with high etching selectivity for the silicon oxide film 24, for example, photoresist and spin on glass. In the case where the photoresist is used as a material of the insulating film 30, a positive photoresist film is spin-coated in the trench 27 and on the silicon oxide film 24, and then, the exposed portion outside the trench 27 is removed by the whole surface exposure and development, and thus, leaving the unexposed portion in the trench 27.

Figure 41:
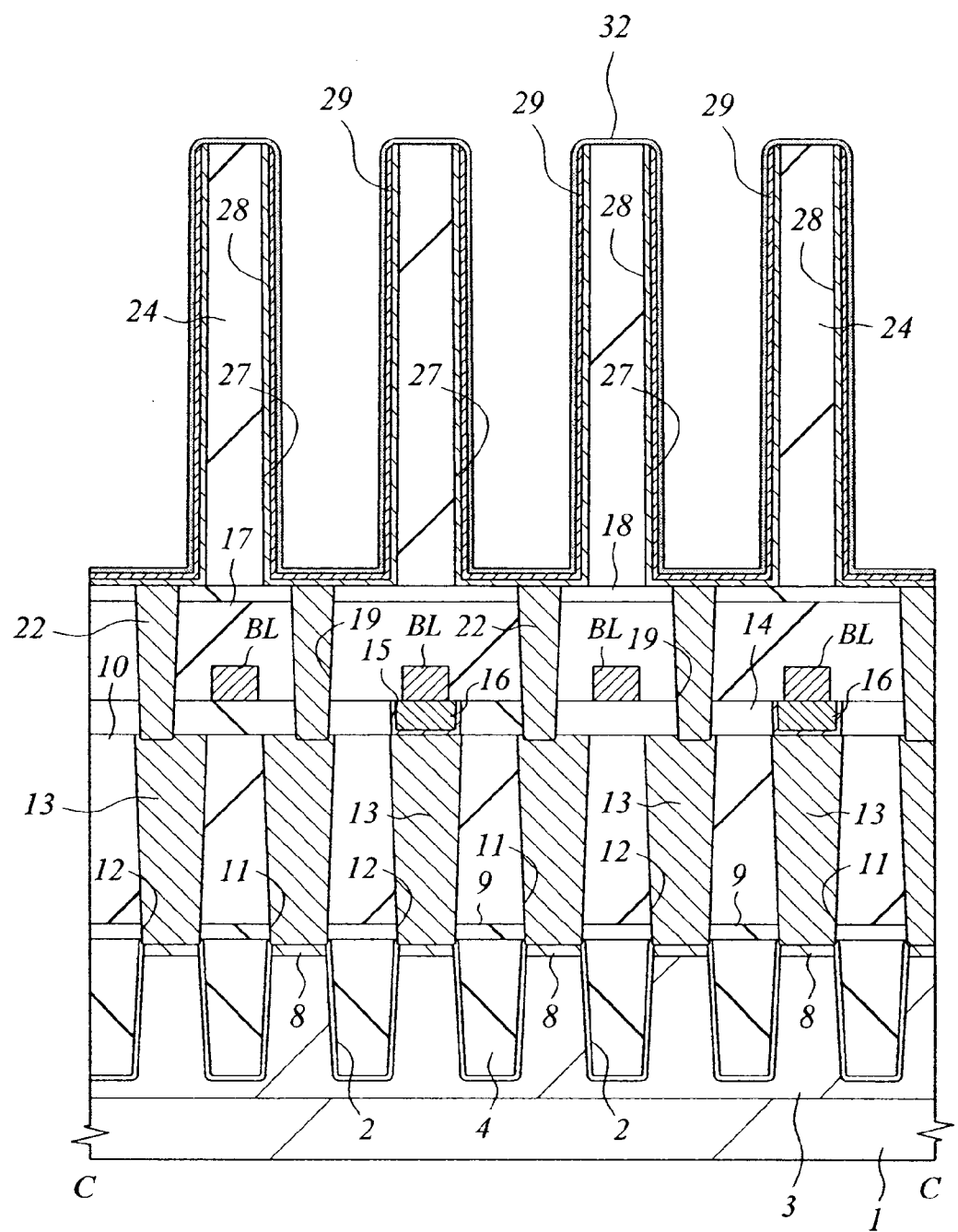
FIG. 41 is a sectional view showing the principal part of a semiconductor substrate, which illustrates a method of manufacturing a DRAM according to an embodiment of the present invention.

Next, after removing the insulating film 30 in the trench 27 by etching, a tantalum oxide ($Ta_2O_5$) film 32, which is so thin (e.g., about 5 to 10 nm) that it cannot fill the trench 27, is deposited on the silicon oxide film 24 and the lower electrode 29 as shown in FIG. 41. The tantalum oxide film 32 is to be a capacitor insulating film of the data storage capacitor, and is deposited by the CVD method using pentaethoxytantalum ($Ta(OC_2H_5)_5$) and oxygen as raw material gas.

Next, for the crystallization and the improvement in film quality of the tantalum oxide film 32, thermal treatment at 300 to 500° C. is performed in an atmosphere containing active oxygen, and then, thermal treatment at 500 to 700° C. is performed in a non oxidizing atmosphere. By performing the thermal treatments, a high-quality tantalum oxide film 32 with little leak current and high dielectric constant can be obtained.

The thermal treatment of the tantalum oxide film 32 causes a part of the oxidant in the atmosphere to permeate through the thin lower electrode 29 (Ru film 29a) and diffuse in the direction of the sidewall and bottom surface of the trench 27. As a result, a high-resistance oxide film (not shown) is formed on the surface of the polycrystalline silicon film 28.

At this time, the size of the region (sidewall and bottom surface of the trench 27) in which the lower electrode 29 and the polycrystalline silicon film 28 are contacted to each other is much larger than that (upper end of the through hole 19) in which the polycrystalline silicon film 28 and the plug 22 below it are contacted to each other. Therefore, oxygen permeated into the lower electrode 29 is consumed at the interface between the lower electrode 29 and the polycrystalline silicon film 28, and thus, no oxygen reaches the surface of the plug 22. More specifically, since no oxide layer is formed on the surface of the plug 22, the conduction failure between the lower electrode 29 and the plug 22 can be surely prevented.

Figure 42:
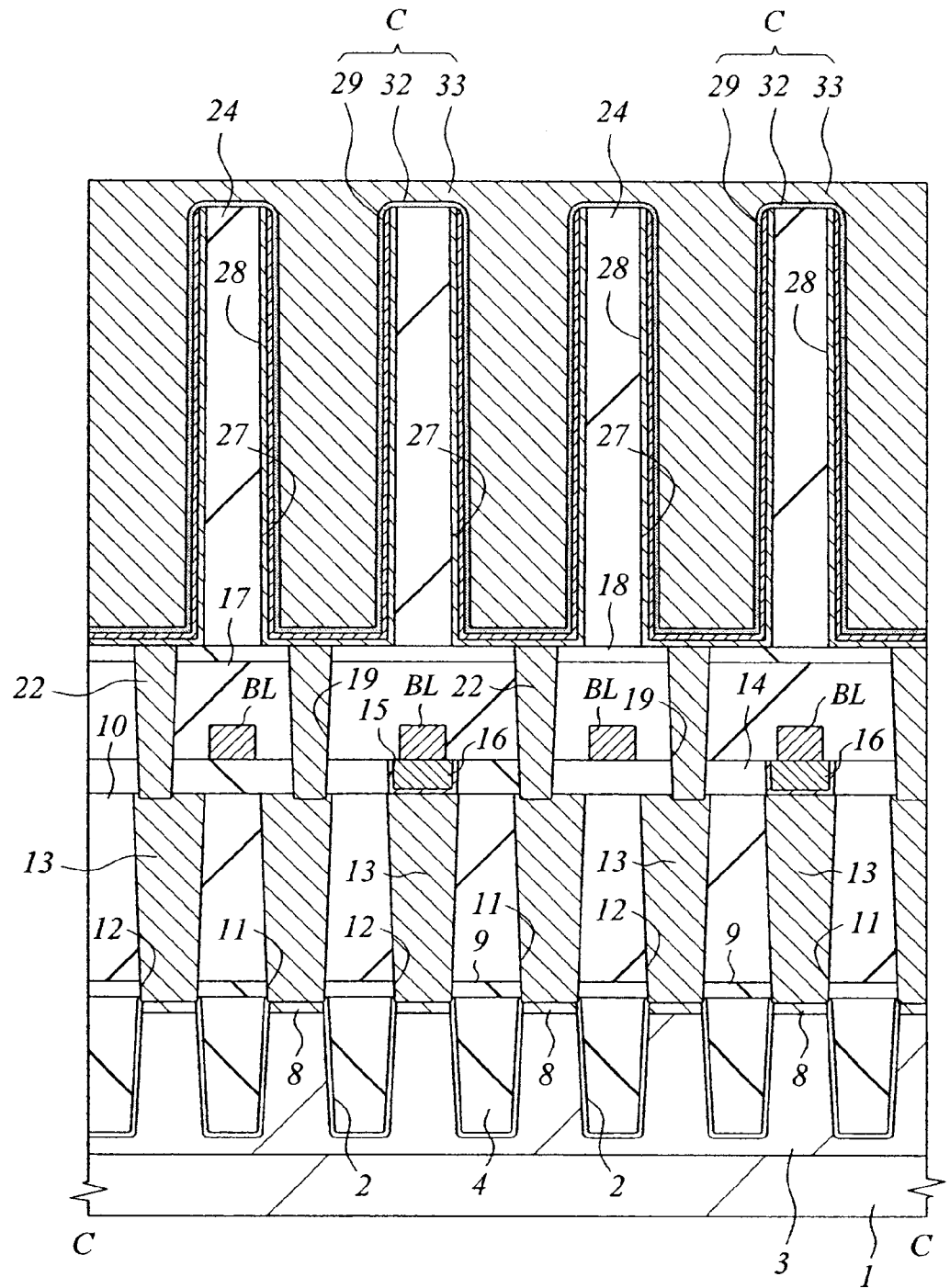
FIG. 42 is a sectional view showing the principal part of a semiconductor substrate, which illustrates a method of manufacturing a DRAM according to an embodiment of the present invention.

Next, as shown in FIG. 42, an upper electrode 33 constituted by an Ru film is formed on the tantalum oxide film 32. The upper electrode 33 is formed in such a manner as follow. That is, an Ru film is deposited on the tantalum oxide film 32 by the CVD method to bury the trench 27. Subsequently, an Ru film is deposited thereon by the sputtering method. Note that the material of the upper electrode is not limited to Ru, and platinum group metal such as Ru, Pt, and Ir, refractory metal such as W, and laminated layer of these metals and TiN are also available to form the upper electrode.

Through the process as described above, the data storage capacitor C comprising the lower electrode 29, the tantalum oxide film (capacitor insulating film) 32, and the upper electrode 33 is completed, and a memory cell comprising the memory cell selecting MISFET Qs and the data storage capacitor C connected in series to the MISFET is almost completed. Thereafter, about two layers of Al wirings are formed over the data storage capacitor C with interposing an interlayer insulating film therebetween, and then, a passivation film is formed on the uppermost Al wiring. However, illustrations thereof are omitted.

As described above, in this embodiment, the polycrystalline silicon film 28 and the lower electrode 29 (Ru film 29a) are contacted to each other on the entire inner surface of the trench 27, and oxygen permeated into the lower electrode 29 at the time of the thermal treatment of the tantalum oxide film 32 is consumed at the interface between the polycrystalline silicon film 28 and the lower electrode 29. Therefore, it is possible to surely prevent the surface oxidation of the plug 22.

As mentioned above, a high-resistance layer made of an oxide layer is formed at the interface between the polycrystalline silicon film 28 and the lower electrode 29 (Ru film 29a) due to the thermal treatment of the tantalum oxide film 32. As a result, a second capacitor comprising the polycrystalline silicon film 28, the high-resistance layer, and the lower electrode 29 is formed in the trench 27 in addition to the original capacitor (data storage capacitor C comprising the lower electrode 29, the tantalum oxide film 32, and the upper electrode 33). Since the surface area of the second capacitor in this case is as large as that of the data storage capacitor C, this structure is equivalent to that two capacitors having almost the same area are connected in series. Therefore, the total amount of the capacity decrease can be reduced by half at the maximum.

Meanwhile, in the case of the conventional technique in which the high-resistance oxide layer is formed on the surface of the plug 22, the surface area of the second capacitor composed of the lower electrode, the oxide layer, and the plug is much smaller than that of the data storage capacitor C. Therefore, the total capacity is greatly reduced due to limitations of the second capacitor with small area, resulting in lack of practicability.

In this embodiment, the decrease in capacity can be prevented by making the capacitor insulating film thin. More specifically, the decrease in capacity can be reduced to the minimum by controlling the conditions in the thermal treatment of the tantalum oxide film 32 so that the thickness of the oxide layer formed at the interface between the polycrystalline silicon film 28 and the lower electrode 29 does not exceed 1 nm.

Also, in such a structure that the polycrystalline silicon film 28 and the Ru film 29a are directly contacted to each other, an Ru silicon layer is formed by the thermal treatment. Due to the volume expansion of this silicide layer, the irregularities on the electrode surface are increased. As a result, mechanical stress is applied to the tantalum oxide film 32 formed on the silicide layer, and the leak current is undesirably increased.

In this embodiment, however, the Ru film 29a that constitutes the lower electrode 29 is formed by the CVD method using the organic ruthenium compound and oxygen. Therefore, foreign substances such as organic matters and oxygen are mixed into the Ru film 29a. In the case where foreign matters such as organic matters and oxygen are contained in the Ru film 29a, silicide reaction between the Ru film 29a and the polycrystalline silicon film 28 is inhibited, and not all of the Ru film 29a is reacted into the Ru silicide. Accordingly, it becomes possible to increase the temperature of the thermal treatment for the crystallization and the improvement in film quality of the tantalum oxide film 32 deposited on the lower electrode 29.

Meanwhile, in the case where the Ru film to be a component of the lower electrode is deposited by the sputtering method, an Ru film, which contains substantially, no foreign matters, is obtained. Consequently, when performing the thermal treatment of the tantalum oxide film, all of the Ru film is reacted into the Ru silicide layer, which causes the volume expansion. As a result, stress is applied to the tantalum oxide film, and the leak current is increased. In this case, the thermal treatment of the tantalum oxide film deposited on the Ru film cannot be sufficiently performed, and the crystallization of the film and the improvement of the film quality become insufficient. Accordingly, such problems that the leak current cannot be reduced and the increase of the capacity cannot be achieved become obvious.

Second Embodiment

The manufacturing method in this second embodiment is identical to that of the first embodiment until the process for forming the trench 27 in the silicon oxide film 24 (processes shown in FIGS. 1 to 37). Therefore, descriptions thereof are omitted, and only the subsequent processes will be described. In addition, the drawings used as references in the following descriptions illustrate only the region where the data storage capacitor C is formed, and illustrations of the lower layers thereof (bit line BL, memory cell selecting MISFET Qs, semiconductor substrate 1, and the like) are omitted.

Figure 43:
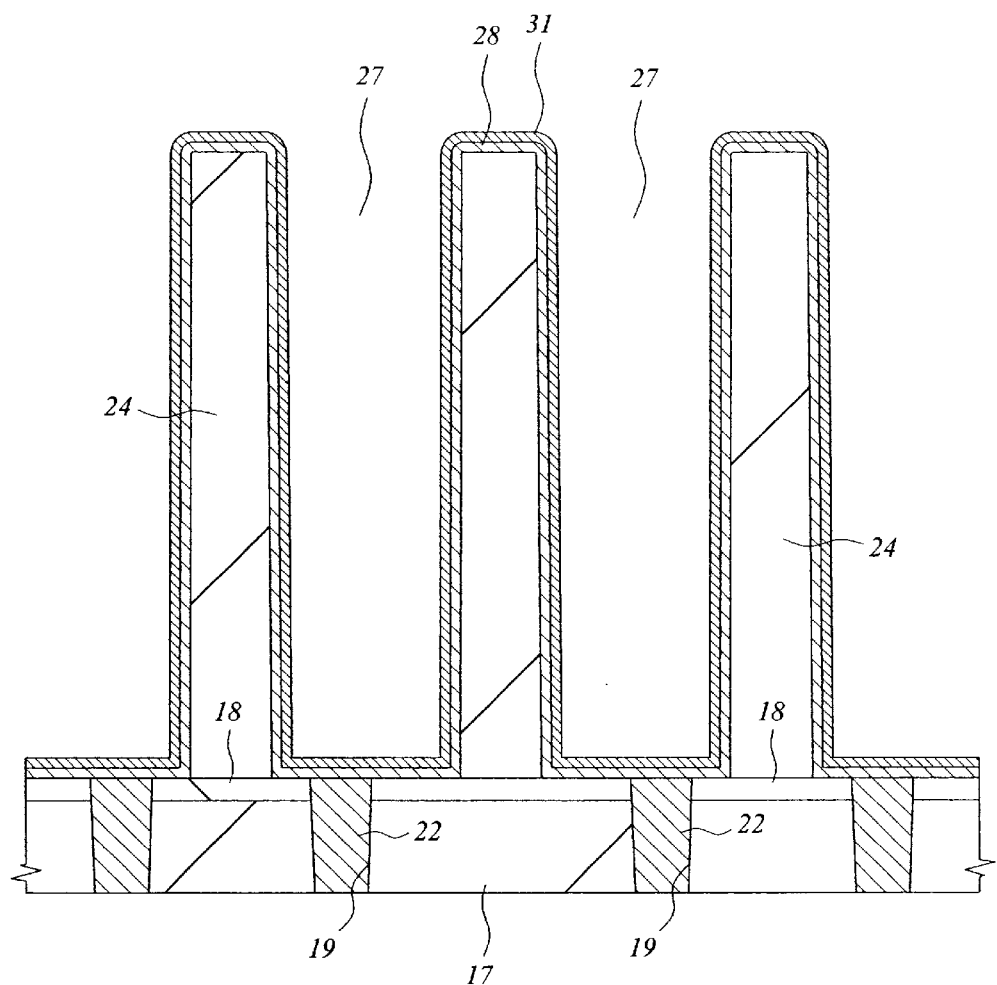
FIG. 43 is a sectional view showing the principal part of a semiconductor substrate, which illustrates a method of manufacturing a DRAM according to another embodiment of the present invention.

First, after the process shown in FIG. 37, the polycrystalline silicon film 28 is deposited on the silicon oxide film 24 having the trench 27 formed therein by the CVD method, and subsequently, a Ti silicide film 31 is formed thereon as shown in FIG. 43. In order to reduce the electric resistance of the polycrystalline silicon film 28, the conductive type of the polycrystalline silicon film 28 is n-type obtained by doping P into the polycrystalline silicon film 28 during the deposition thereof. The Ti silicide film 31 is formed in such a manner as follows. That is, a Ti film is deposited on the polycrystalline silicon film 28 by the sputtering method, and subsequently, a part of the polycrystalline silicon film 28 and the Ti film are reacted to each other by performing a thermal treatment. Also, it is also preferable to directly deposit the Ti silicide film 31 on the polycrystalline silicon film 28 by the CVD method.

Figure 44:
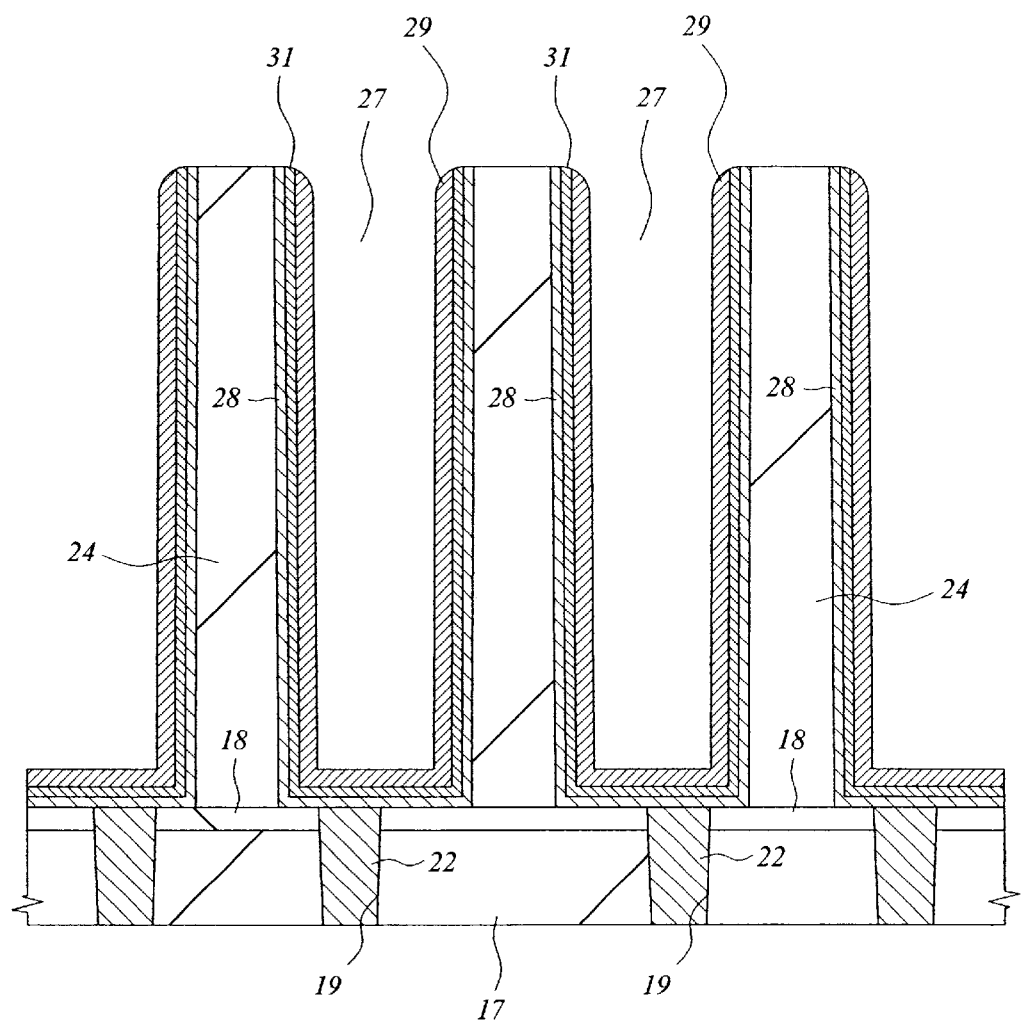
FIG. 44 is a sectional view showing the principal part of a semiconductor substrate, which illustrates a method of manufacturing a DRAM according to another embodiment of the present invention.

Next, after depositing an Ru film (not shown) on the Ti silicide film 31, the polycrystalline silicon film 28, the Ti silicide film 31, and the Ru film outside the trench 27 are removed by dry etching in the same manner as that in the first embodiment, thereby forming the lower electrode 29 constituted by the Ru film on the sidewall and bottom surface of the trench 27 as shown in FIG. 44. At this time, the polycrystalline silicon film 28 and the Ti silicide film 31 are left between the sidewall and bottom surface of the trench 27 and the lower electrode 29.

Figure 45:
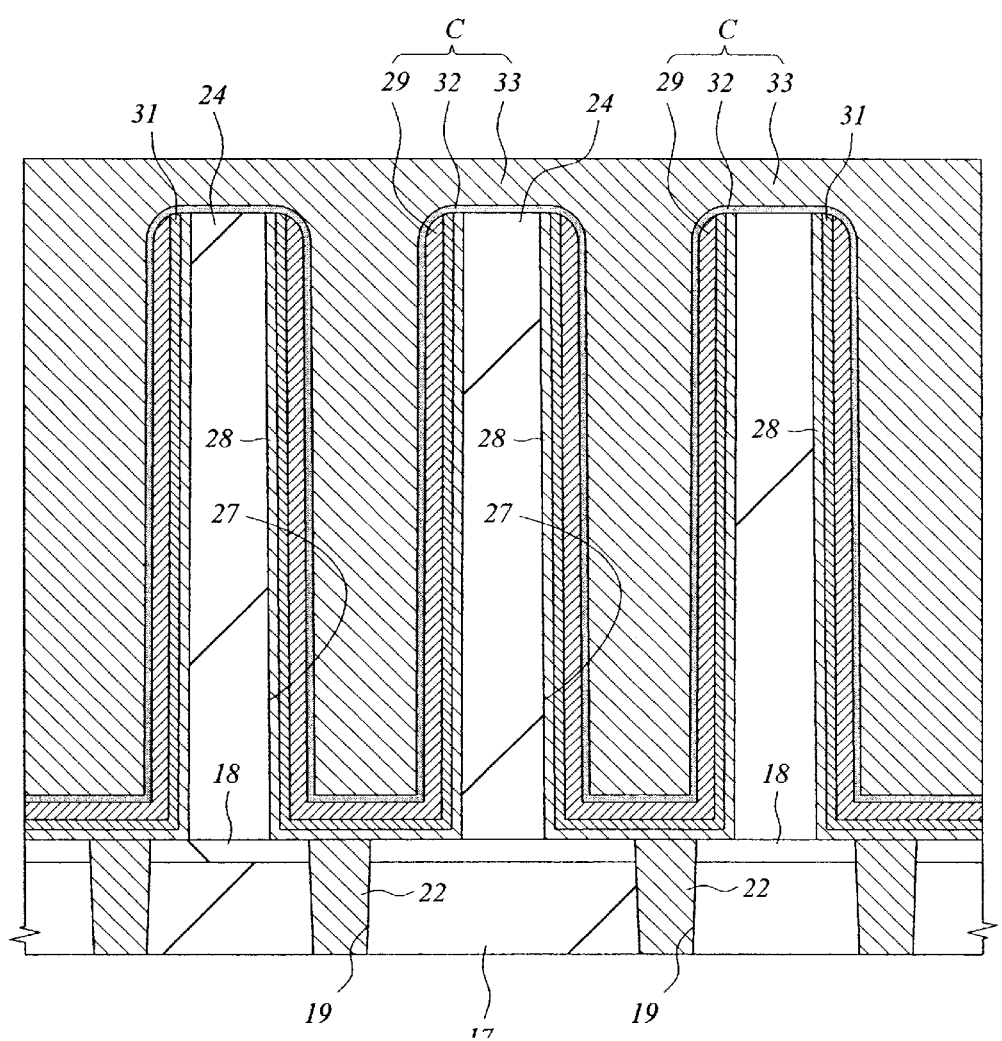
FIG. 45 is a sectional view showing the principal part of a semiconductor substrate, which illustrates a method of manufacturing a DRAM according to another embodiment of the present invention.

Thereafter, as shown in FIG. 45, the tantalum oxide film 32 is deposited on the silicon oxide film 24 and the lower electrode 29 by the CVD method, and then, thermal treatment for the crystallization and the improvement in film quality of the tantalum oxide film 32 is performed. Thereafter, the upper electrode 33 made of Ru is formed on the tantalum oxide film 32, thereby forming the data storage capacitor C.

As described above, in this embodiment, the Ti silicide film 31 is provided between the lower electrode 29 and the polycrystalline silicon film 28, by which the Ru film constituting the lower electrode 29 does not directly contact to the polycrystalline silicon film 28. Such a structure makes it possible to prevent the silicide reaction between the lower electrode 29 (Ru film) and the polycrystalline silicon film 28 at the time of the thermal treatment of the tantalum oxide film 32. Therefore, the oxidation of the surface of the plug 22 can be surely prevented. In addition, since it is possible to prevent the silicidation of the lower electrode 29 (Ru film), the temperature of the thermal treatment for the tantalum oxide film 32 deposited thereon can be increased. Note that, in this embodiment, it is also possible to use a single layer structure of the Ti silicide film 31, that of titanium nitride, or that of tantalum nitride instead of the lamination structure of the polycrystalline silicon film 28 and the Ti silicide film 31. More specifically, it is possible to eliminate the polycrystalline silicon film 28. Note that, in the case where the single layer structure of titanium nitride is used, it is desirable to oxidize the exposed portion of the titanium nitride to convert it into titanium oxide at the stage of FIG. 44 when the upper end of the titanium nitride is exposed.

Third Embodiment

The manufacturing method in this embodiment is identical to that of the first embodiment until the process for forming the trench 27 in the silicon oxide film 24 (processes shown in FIGS. 1 to 37). Therefore, descriptions thereof are omitted, and only the subsequent processes will be described.

Figure 46:
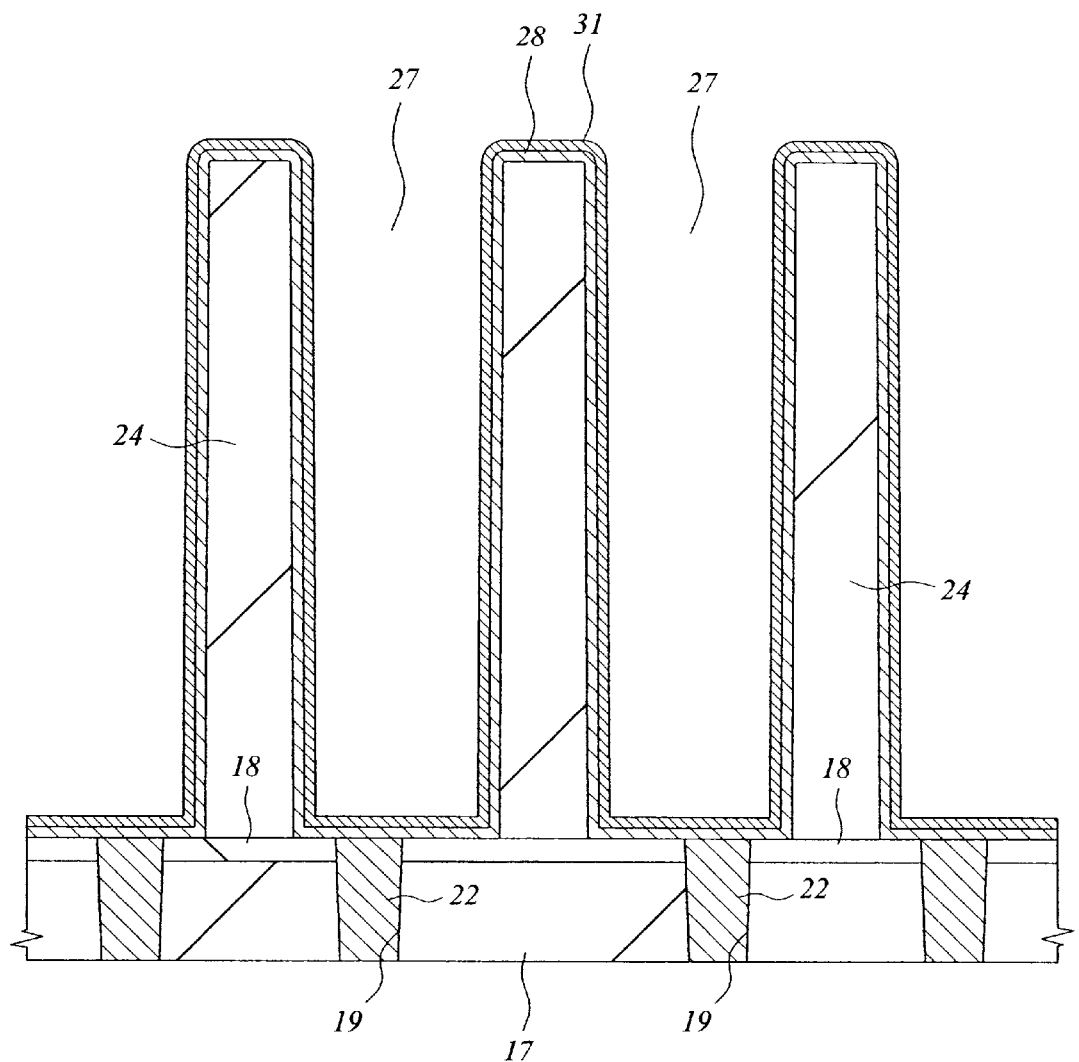
FIG. 46 is a sectional view showing the principal part of a semiconductor substrate, which illustrates a method of manufacturing a DRAM according to another embodiment of the present invention.

First, after the process shown in FIG. 37, the polycrystalline silicon film 28 is deposited on the silicon oxide film 24 having the trench 27 formed therein by the CVD method, and subsequently, the Ti silicide film 31 is formed thereon as shown in FIG. 46. In order to reduce the electric resistance of the polycrystalline silicon film 28, the conductive type of the polycrystalline silicon film 28 is n-type obtained by doping P into the polycrystalline silicon film 28 during the deposition thereof. Similarly to the second embodiment, the Ti silicide film 31 is formed in such a manner as follows. That is, a Ti film is deposited on the polycrystalline silicon film 28 by the sputtering method, and subsequently, a part of the polycrystalline silicon film 28 and the Ti film are reacted to each other by performing a thermal treatment. Alternatively, the Ti silicide film 31 is directly deposited on the polycrystalline silicon film 28 by the CVD method.

Figure 47:
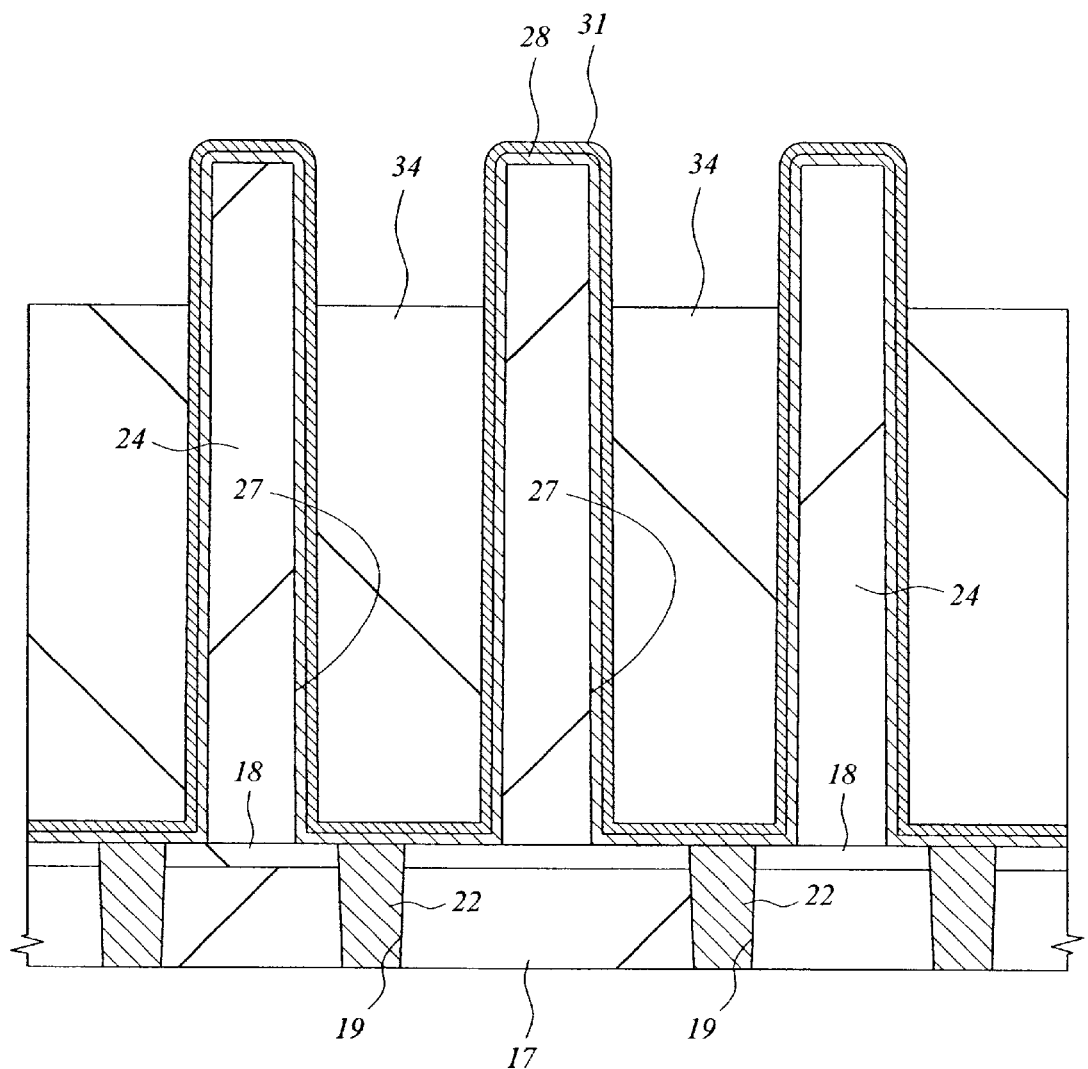
FIG. 47 is a sectional view showing the principal part of a semiconductor substrate, which illustrates a method of manufacturing a DRAM according to another embodiment of the present invention.

Next, as shown in FIG. 47, an insulating film 34 made of photoresist, spin on glass and the like is buried in the trench 27. The insulating film 34 is buried therein not to the entire depth thereof so that the Ti silicide film 31 near the upper end of the trench 27 is not covered therewith.

Figure 48:
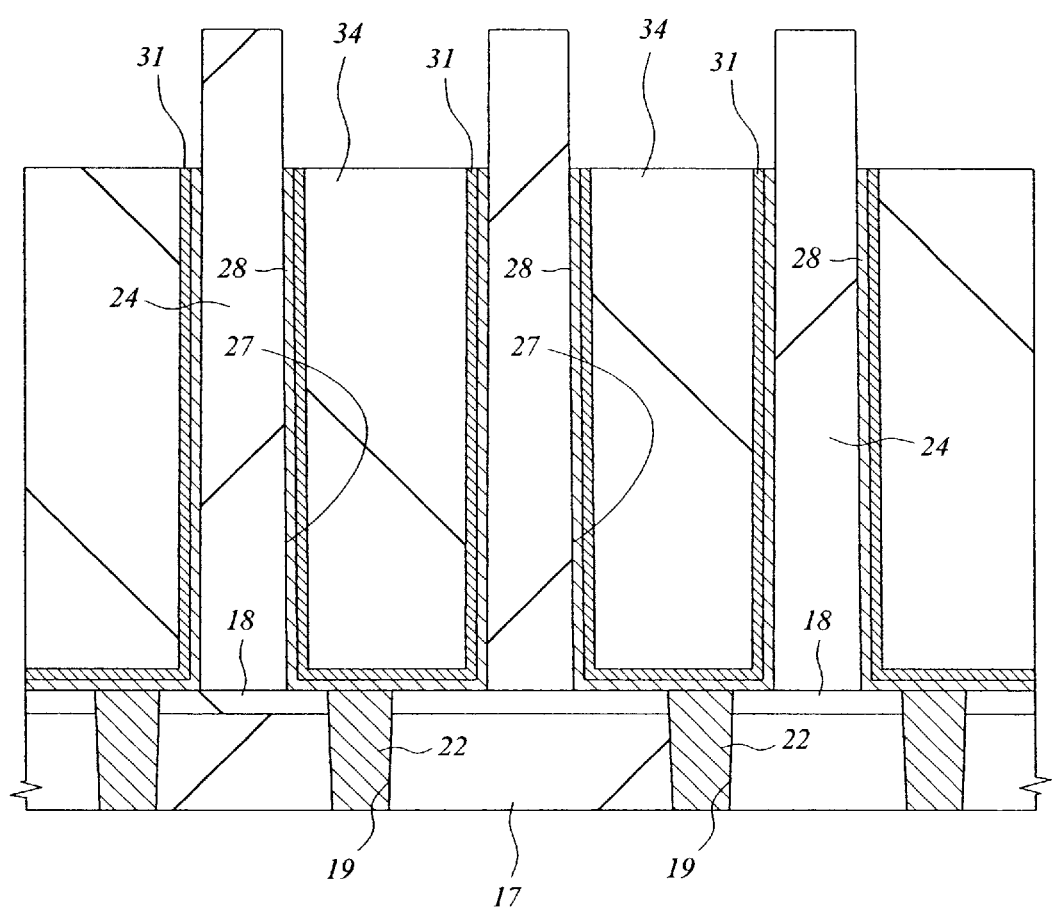
FIG. 48 is a sectional view showing the principal part of a semiconductor substrate, which illustrates a method of manufacturing a DRAM according to another embodiment of the present invention.

Next, as shown in FIG. 48, the part not covered with the insulating film 34, more specifically, the Ti silicide film 31 and the polycrystalline silicon film 28 near the upper end of the trench 27 and those outside the trench 27 are removed by dry etching.

Figure 49:
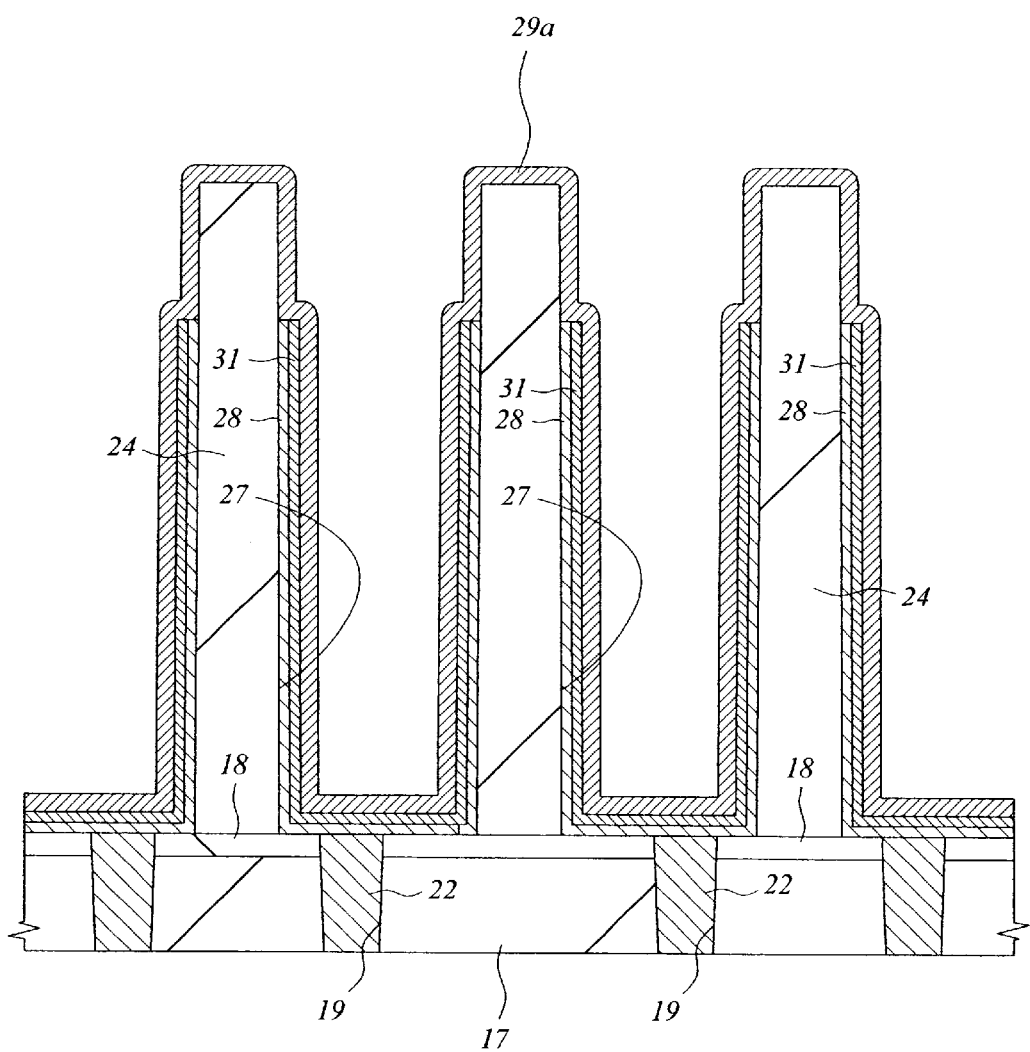
FIG. 49 is a sectional view showing the principal part of a semiconductor substrate, which illustrates a method of manufacturing a DRAM according to another embodiment of the present invention.
Figure 50:
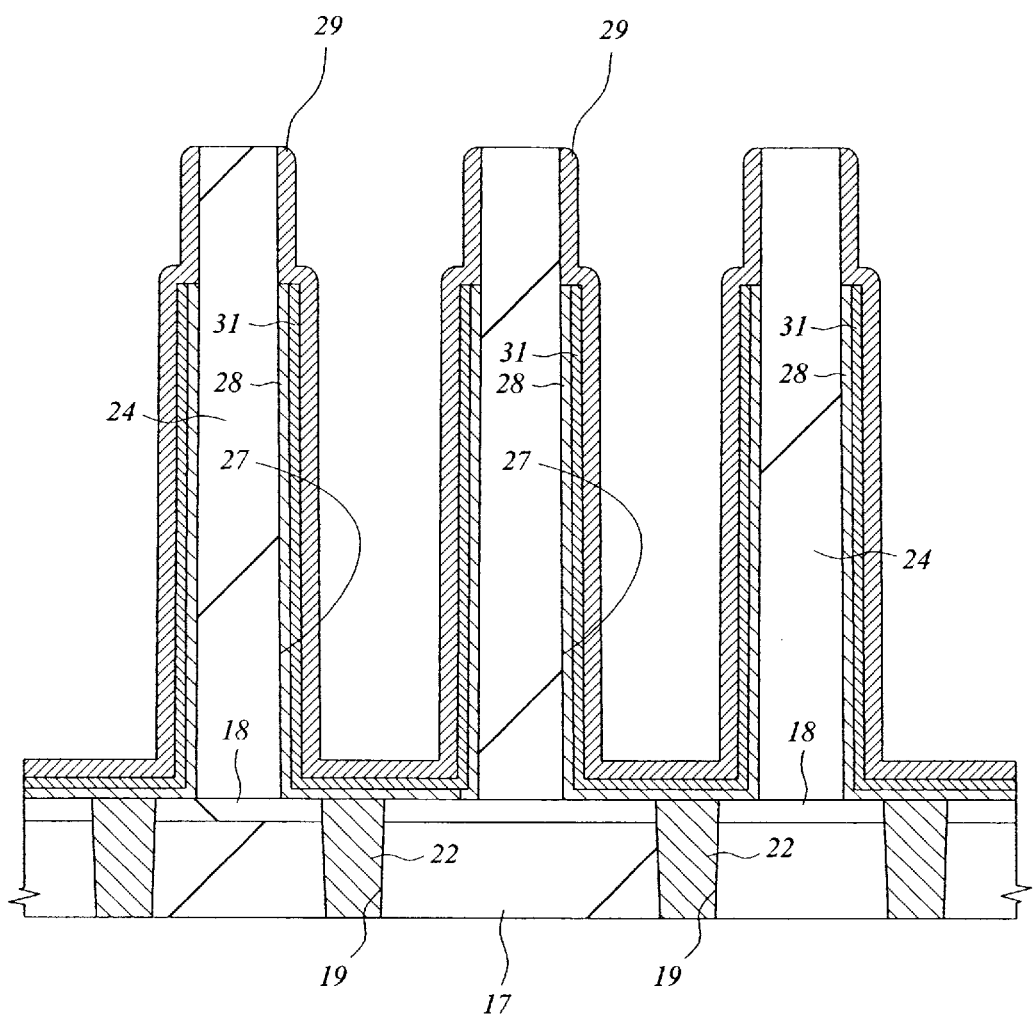
FIG. 50 is a sectional view showing the principal part of a semiconductor substrate, which illustrates a method of manufacturing a DRAM according to another embodiment of the present invention.

Next, after removing the insulating film 34 in the trench 27 by etching, the Ru film 29a is deposited on the silicon oxide film 24 and the trench 27 as shown in FIG. 49. Subsequently, the Ru film 29a outside the trench 27 is removed in the same manner as that of the first embodiment as shown in FIG. 50. Accordingly, the lower electrode 29 constituted by the Ru film 29a is formed on the sidewall and bottom surface of the trench 27. In addition, the polycrystalline silicon film 28 and the Ti silicide film 31 are left between the sidewall and bottom surface of the trench 27 and the lower electrode 29.

Figure 51:
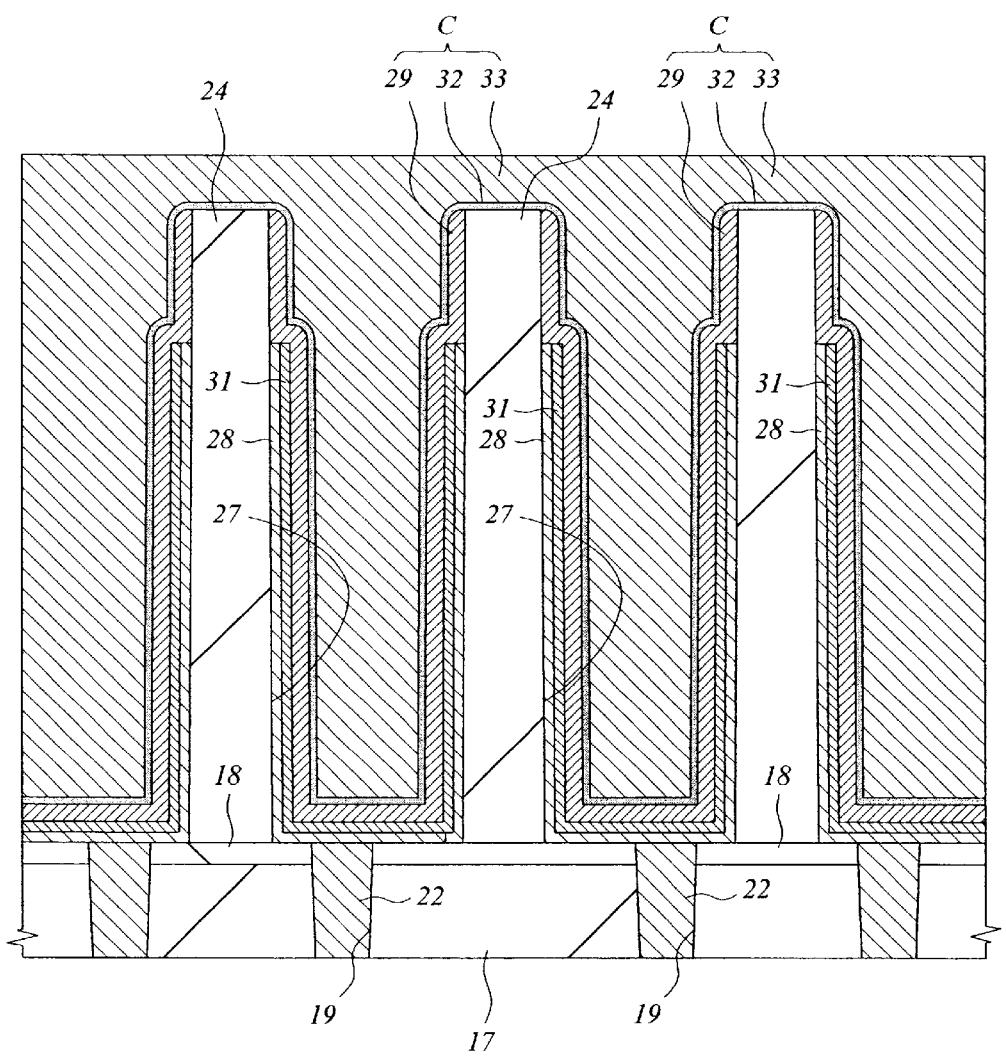
FIG. 51 is a sectional view showing the principal part of a semiconductor substrate, which illustrates a method of manufacturing a DRAM according to another embodiment of the present invention.

Then, as shown in FIG. 51, the tantalum oxide film 32 is deposited on the silicon oxide film 24 and the lower electrode 29 by the CVD method, and subsequently, the thermal treatment for the crystallization of the film and the improvement in film quality is performed. Thereafter, the upper electrode 33 made of Ru and the like is formed on the tantalum oxide film 32, thereby forming the data storage capacitor C.

As described above, in this embodiment, since the upper ends of the polycrystalline silicon film 28 and the Ti silicide film 31 formed in the trench 27 are positioned below the upper end of the trench 27, the tantalum oxide film 32 formed on the lower electrode 29 does not contact to the polycrystalline silicon film 28 and the Ti silicide film 31 at the upper end of the trench 27. According to this embodiment, the possibility of increase of the leak current in the tantalum oxide film 32 resulting from the contact between the tantalum oxide film 32 and the polycrystalline silicon film 28 or the Ti silicide film 31 at the upper end of the trench 27 can be surely prevented. In addition, it is also possible to use a single layer of titanium nitride or tantalum nitride instead of the laminated film of the polycrystalline silicon film 28 and the titanium silicide film 31 in this embodiment.

When a polycrystalline silicon film is used in the structure of the above-described embodiment, the upper end of the polycrystalline silicon film 28 formed in the trench 27 contacts to the lower electrode 29 (Ru film 29a). As mentioned above, since the Ru film 29a deposited by the CVD method using organic ruthenium compound and oxygen contains foreign substances such as organic matters and oxygen, silicide reaction hardly occurs. However, in the case of the Ru film 29a deposited by the sputtering method or the CVD method with small amount of foreign substances, the silicide reaction causing volume expansion occurs at the portion where the polycrystalline silicon film 28 is contacted to the Ru film 29a. Accordingly, there is the possibility that stress is applied to the tantalum oxide film 32, and the leak current is increased. So, the method of preventing the increase of the leak current will be described.

Figure 52:
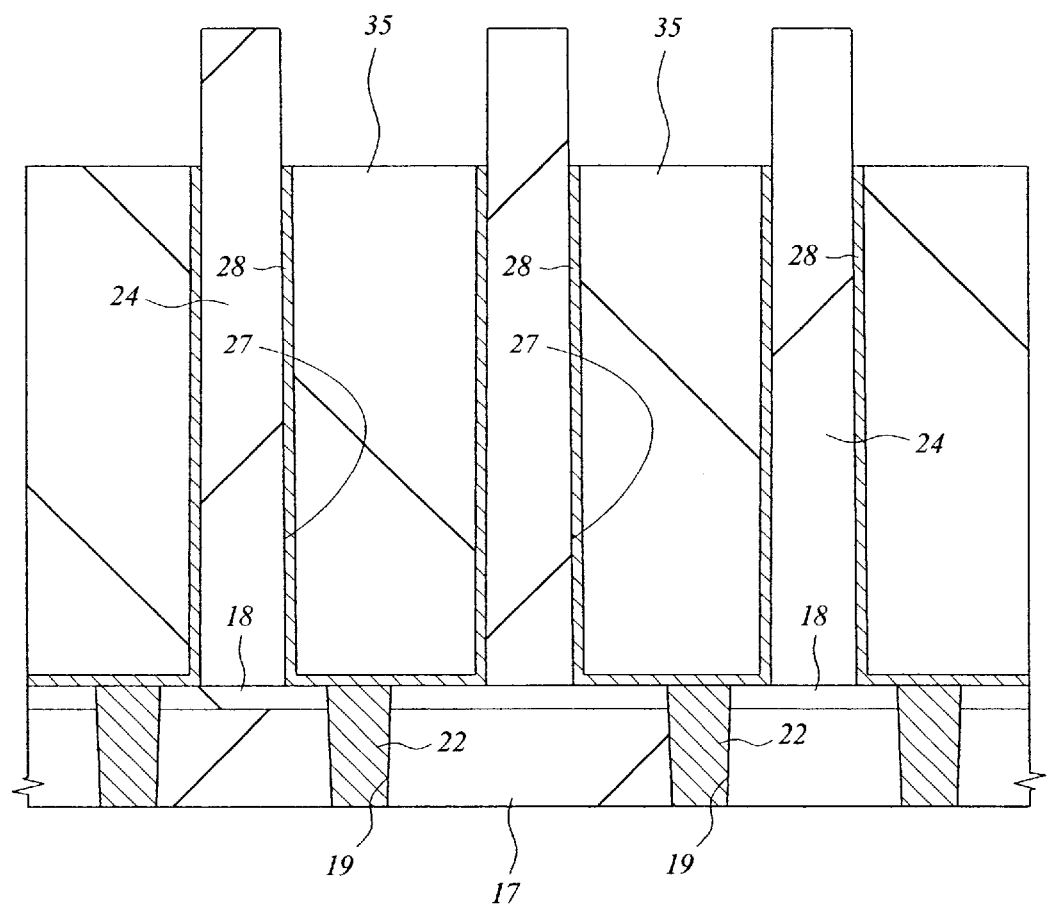
FIG. 52 is a sectional view showing the principal part of a semiconductor substrate, which illustrates a method of manufacturing a DRAM according to another embodiment of the present invention.

First, as shown in FIG. 52, the polycrystalline silicon film 28 is deposited by the CVD method on the silicon oxide film 24 having the trench 27 formed therein, and subsequently, the insulating film 35 is buried in the trench 27. Thereafter, the part of the polycrystalline silicon film 28 not covered with the insulating film 35 is removed by dry etching. The insulating film 35 is buried in the trench 27 but not fully, so that the polycrystalline silicon film 28 near the upper end of the trench 27 can be removed.

Figure 53:
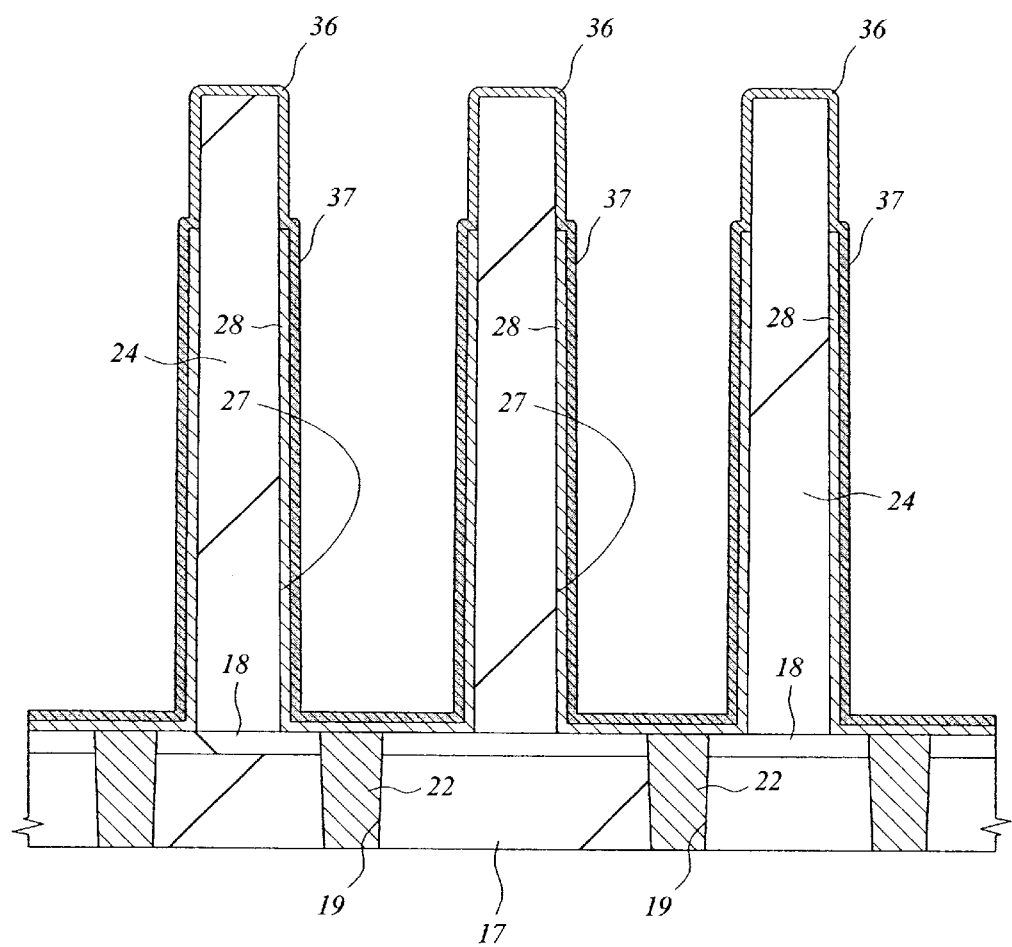
FIG. 53 is a sectional view showing the principal part of a semiconductor substrate, which illustrates a method of manufacturing a DRAM according to another embodiment of the present invention.

Next, as shown in FIG. 53, after depositing the Ti film 36 on the polycrystalline silicon film 28 by the sputtering method, thermal treatment is performed to silicidize the part of the Ti film 36 to which the polycrystalline silicon film 28 is contacted, thereby forming a Ti silicide film 37.

Figure 54:
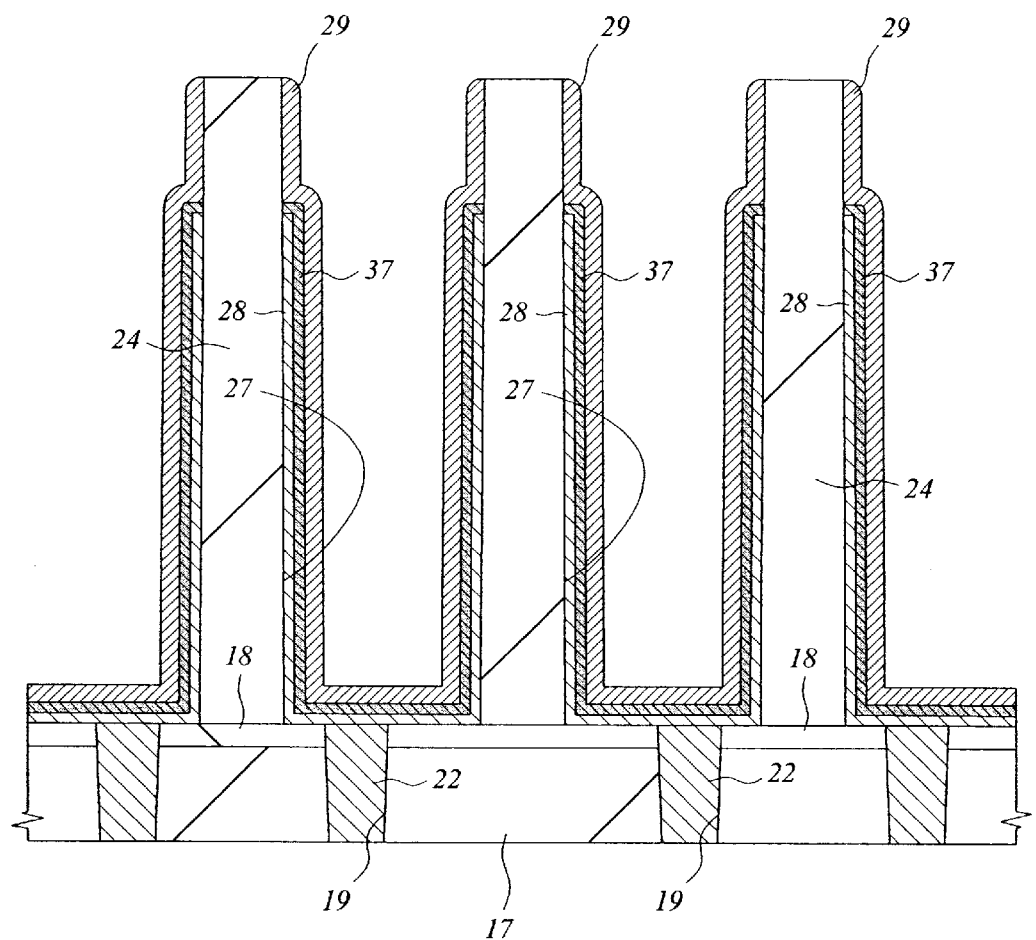
FIG. 54 is a sectional view showing the principal part of a semiconductor substrate, which illustrates a method of manufacturing a DRAM according to another embodiment of the present invention.

Next, as shown in FIG. 54, after removing the unreacted Ti film 36 remaining on the silicon oxide film 24 and on the upper end of the trench 27 by etching, the lower electrode 29 constituted by the Ru film (29a) is formed by the above-mentioned method. Thereafter, although illustrations thereof are omitted, the tantalum oxide film 32 and the upper electrode 33 are formed on the lower electrode 29 by the above-mentioned method.

According to the method described above, since the entire surface of the polycrystalline silicon film 28 is covered with the Ti silicide film 37, the increase of the leak current in the tantalum oxide film 32 resulting from the contact between the lower electrode 29 (Ru film 29a) and the polycrystalline silicon film 28 can be surely prevented.

As another method of preventing the contact between the lower electrode 29 (Ru film 29a) and the polycrystalline silicon film 28, a single layer structure of the Ti silicide film 37, that of titanium nitride, or that of tantalum nitride can be used instead of the lamination structure of the polycrystalline silicon film 28 and the Ti silicide film 37. More specifically, the polycrystalline silicon film 28 may be eliminated.

In the foregoing, the invention made by the inventors of this invention has been described in detail based on the embodiments. However, the present invention is not limited to the first to third embodiments, and various changes and modifications of the invention can be made without departing from the spirit and scope of the invention.

For example, it is also preferable to combine the structure of the present invention and that of the prior art in which a barrier layer is formed on a surface of a plug (22) made of polycrystalline silicon. In addition, the process of depositing the Ru film constituting the lower electrode can be divided into two processes, and the process of depositing the tantalum oxide film constituting the capacitor insulating film can also be divided into two processes. The tantalum oxide film deposited by the CVD method has characteristics as follows. That is, when the underlayer of the tantalum oxide film is amorphous, the tantalum oxide film is also amorphous, and when the underlayer thereof is crystalline, the tantalum oxide film is also crystalline. Therefore, if a tantalum oxide film is deposited on another tantalum film which is subjected to the thermal treatment for the crystallization and improvement in film quality, a film with good crystallinity can be obtained. Accordingly, it becomes possible to further reduce the leak current in the capacitor insulating film.

The case where the present invention is applied to the manufacturing process of a DRAM has been described in the first to third embodiments. However, it is useless to say that the present invention can be applied to the logic embedded DRAM as well as the general-purpose DRAM.

The advantages achieved by the typical one of the inventions disclosed in this application will be briefly described as follows.

According to the typical structure of the present invention, since a silicon plug below a lower electrode is not oxidized when performing a thermal treatment in an oxygen atmosphere to a capacitor insulating film which is made of dielectric material and is formed on the lower electrode of a data storage capacitor, the conduction failure between the lower electrode and the silicon plug can be surely prevented. Consequently, the improvement in reliability and the manufacturing yield of the DRAM can be achieved.

What is claimed is:

1. A method of manufacturing a semiconductor integrated circuit device, comprising the steps of:

(a) forming a first connection hole in a first insulating film formed over a main surface of a semiconductor substrate, and burying a first conductive layer in the first connection hole;

(b) forming a second insulating film over the first insulating film, and forming a trench in the second insulating film over the first connection hole;

(c) forming a metal silicide layer over a sidewall and bottom surface of the trench, the metal silicide layer being electrically connected to the first conductive layer in the first connection hole;

(d) forming a lower electrode of a capacitor over the metal silicide layer;

(e) forming a capacitor insulating film of the capacitor over the lower electrode; and (f) forming an upper electrode of the capacitor over the capacitor insulating film, wherein a thermal treatment is performed in an oxidizing atmosphere after forming the capacitor insulating film of the capacitor, and wherein a thermal treatment is further performed in a non-oxidizing atmosphere after the thermal treatment.

2. The method of manufacturing a semiconductor integrated circuit device according to claim 1, wherein, prior to the step (c), the method further comprises the step of forming a polycrystalline silicon layer over the sidewall and bottom surface of the trench.

3. The method of manufacturing a semiconductor integrated circuit device according to claim 1, wherein the metal silicide layer is formed so as to cover an entire surface of the sidewall and bottom surface of the trench.

4. The method of manufacturing a semiconductor integrated circuit device according to claim 1, wherein a conductive layer constituting the lower electrode of the capacitor is deposited by the CVD method using organic source gas.

5. The method of manufacturing a semiconductor integrated circuit device according to claim 4, wherein the conductive layer constituting the lower electrode of the capacitor is deposited in an oxidizing atmosphere.

6. The method of manufacturing a semiconductor integrated circuit device according to claim 5, wherein a thermal treatment is performed in a reducing atmosphere after depositing the conductive layer constituting the lower electrode of the capacitor.

7. The method of manufacturing a semiconductor integrated circuit device according to claim 1, wherein a conductive layer constituting the lower electrode of the capacitor is made of platinum group metal, and the metal silicide layer is made of metal other than the platinum group metal.

8. The method of manufacturing a semiconductor integrated circuit device according to claim 7, wherein the platinum group metal is ruthenium.

9. The method of manufacturing a semiconductor integrated circuit device according to claim 1, wherein the metal silicide layer is made of titanium silicide.

10. The method of manufacturing a semiconductor integrated circuit device according to claim 1, wherein the first conductive layer in the first connection hole is made of silicon.

11. The method of manufacturing a semiconductor integrated circuit device according to claim 1, wherein the capacitor insulating film of the capacitor is made of tantalum oxide.

12. A method of manufacturing a semiconductor integrated circuit device, comprising the steps of:

(a) forming a first connection hole in a first insulating film formed over a main surface of a semiconductor substrate, and burying a first conductive layer in the first connection hole;

(b) forming a second insulating film over the first insulating film, and forming a trench in the second insulating film over the first connection hole;

(c) forming a metal silicide layer over a sidewall and bottom surface of the trench, the metal silicide layer being electrically connected to the first conductive layer in the first connection hole, and lowering a position of an upper end of the metal silicide layer over the sidewall of the trench to below an upper end of the trench;

(d) after the step (c), forming a lower electrode of a capacitor over the sidewall and bottom surface of the trench to cover an entire surface of the metal silicide layer with the lower electrode;

(e) forming a capacitor insulating film of the capacitor over the lower electrode; and (f) forming an upper electrode of the capacitor on the capacitor insulating film, wherein a thermal treatment is performed in an oxidizing atmosphere after forming the capacitor insulating film of the capacitor, and wherein a thermal treatment is further performed in a non-oxidizing atmosphere after the thermal treatment.

13. The method of manufacturing a semiconductor integrated circuit device according to claim 12, wherein the step (c) includes the steps of: (c-1) forming a metal silicide layer over the entire of the sidewall and bottom surface of the trench; (c-2) burying an insulating film in the trench having the metal silicide layer formed thereon so that the height of the upper surface of the insulating film becomes lower than that of the upper end of the trench; and (c-3) removing the metal silicide layer exposed over the upper end of the insulating film by etching using the insulating film as a mask, and then, removing the insulating film.

14. The method of manufacturing a semiconductor integrated circuit device according to claim 12, wherein prior to the step (c), the method further comprises the step of forming a polycrystalline silicon layer over the sidewall and bottom surface of the trench.

15. The method of manufacturing a semiconductor integrated circuit device according to claim 12, wherein the first conductive layer in the first connection hole is made of silicon.

16. The method of manufacturing a semiconductor integrated circuit device according to claim 12, wherein the metal silicide layer is made of titanium silicide.

17. The method of manufacturing a semiconductor integrated circuit device according to claim 12, wherein the capacitor insulating film of the capacitor is made of tantalum oxide.

18. The method of manufacturing a semiconductor integrated circuit device according to claim 12, wherein the lower electrode is made of Ru.

19. A method of manufacturing a semiconductor integrated circuit device, comprising the steps of:

(a) forming a first connection hole in a first insulating film formed over a main surface of a semiconductor substrate, and burying a first conductive layer in the first connection hole;

(b) forming a second insulating film over the first insulating film, and forming a trench in the second insulating film over the first connection hole;

(c1) forming a polycrystalline silicon layer over a sidewall and bottom surface of the trench, electrically connected to the first conductive layer in the first connection hole;

(c2) forming a metal suicide layer over the polycrystalline silicon layer;

(d) after the step (c2), forming a lower electrode of a capacitor constituted by a second conductive layer over the polycrystalline silicon layer by the CVD method;

(e) forming a capacitor insulating film of the capacitor over the lower electrode; and (f) forming an upper electrode of the capacitor over the capacitor insulating film, wherein a thermal treatment is performed in an oxidizing atmosphere after forming the capacitor insulating film of the capacitor, and wherein a thermal treatment is further performed in a non-oxidizing atmosphere after the thermal treatment.

20. The method of manufacturing a semiconductor integrated circuit device according to claim 19, wherein the second conductive layer is made of Ru.

* * * * *